United States Patent
Chang et al.

(10) Patent No.: US 12,484,411 B2
(45) Date of Patent: Nov. 25, 2025

(54) METHOD OF MANUFACTURING DISPLAY DEVICE

(71) Applicant: Samsung Display Co., Ltd., Yongin-si (KR)

(72) Inventors: Sun-Young Chang, Seoul (KR); Suk Hoon Kang, Seoul (KR); Jeongsoo Kim, Asan-si (KR); Hyungjun Yu, Asan-si (KR); Hyungguen Yoon, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 761 days.

(21) Appl. No.: 17/697,864

(22) Filed: Mar. 17, 2022

(65) Prior Publication Data
US 2022/0407041 A1  Dec. 22, 2022

(30) Foreign Application Priority Data

Jun. 17, 2021  (KR) ........................ 10-2021-0078714

(51) Int. Cl.
*G03F 7/16* (2006.01)
*H01L 21/68* (2006.01)
(Continued)

(52) U.S. Cl.
CPC ......... *H10K 59/38* (2023.02); *H10K 59/8723* (2023.02); *H10K 59/877* (2023.02)

(58) Field of Classification Search
CPC .. H10K 59/38; H10K 59/8723; H10K 59/877; H10K 71/00; H10K 71/851;
(Continued)

(56) References Cited

U.S. PATENT DOCUMENTS 8,710,527 B2  4/2014  Moon et al.
8,946,733 B2  2/2015  Prushinskiy et al.
(Continued)

FOREIGN PATENT DOCUMENTS

KR         10-0402288      10/2003
KR     10-2005-0022530      2/2006
(Continued)

OTHER PUBLICATIONS

Chris Valentine, Resist Coating Methods, inseto, (IKB067, Rev 1) (Year: 2020).*
(Continued)

*Primary Examiner* — Dale E Page
*Assistant Examiner* — Daniel J Hibbert
(74) *Attorney, Agent, or Firm* — CANTOR COLBURN LLP

(57) ABSTRACT

A method of manufacturing a display device includes providing a mother substrate including a first cell region, a second cell region, and a peripheral region. First alignment keys arranged in a first direction in the peripheral region on the mother substrate is formed such that the first alignment keys are adjacent to a first side portion of each of first and second light emitting structures, while forming the first and second light emitting structures in the first and second cell regions on the mother substrate, respectively. A photoresist is formed in a second direction on the first and second light emitting structures by using a coater such that the photoresist does not to overlap the first alignment keys. The mother substrate is rotated at a preset angle. A light is irradiated to the photoresist by moving an exposer in a direction in which the first alignment keys are arranged.

17 Claims, 23 Drawing Sheets

(51) Int. Cl.
*H10K 59/38* (2023.01)
*H10K 59/80* (2023.01)

(58) Field of Classification Search
CPC .......................... H10K 71/166; H10K 71/233; H01L 21/0274; H01L 21/68; G03F 7/0007; G03F 7/16; G03F 9/70
See application file for complete search history.

(56) References Cited

U.S. PATENT DOCUMENTS

| | | | | |
|---|---|---|---|---|
| 2009/0195739 | A1* | 8/2009 | Chang | G02F 1/133512 |
| | | | | 349/110 |
| 2016/0109794 | A1 | 4/2016 | Jang et al. | |
| 2017/0307935 | A1* | 10/2017 | Park | G02F 1/1368 |
| 2018/0188595 | A1* | 7/2018 | Kim | G02F 1/133514 |
| 2020/0105522 | A1* | 4/2020 | Liu | G03F 7/40 |
| 2020/0259056 | A1* | 8/2020 | Hong | H10H 20/857 |
| 2020/0321401 | A1* | 10/2020 | Ahn | H10K 71/00 |
| 2021/0134589 | A1 | 5/2021 | Weng et al. | |

FOREIGN PATENT DOCUMENTS

| | | |
|---|---|---|
| KR | 10-2009-0039602 | 4/2009 |
| KR | 10-2016-0046273 | 4/2016 |
| KR | 10-2017-0000443 | 1/2017 |
| KR | 10-1839929 | 3/2018 |
| KR | 10-1884737 | 8/2018 |
| KR | 10-2021-0053232 | 5/2021 |

OTHER PUBLICATIONS

Korean Office Action dated Feb. 12, 2025, in Korean Patent Application No. 10-2021-0078714.

* cited by examiner

METHOD OF MANUFACTURING DISPLAY DEVICE

CROSS-REFERENCE TO RELATED APPLICATION

This application claims priority from and the benefit of Korean Patent Application No. 10-2021-0078714, filed on Jun. 17, 2021, which is hereby incorporated by reference for all purposes as if fully set forth herein.

BACKGROUND

Field

Embodiments of the invention relate generally to a method of manufacturing a display device, and more specifically, to a method of manufacturing a display device including an alignment key.

Discussion of the Background

Flat panel display devices have been used as display devices to replace cathode ray tube (CRT) display devices since they are lighter and thinner. Examples of such flat panel display devices include liquid crystal display (LCD) devices and organic light emitting diode (OLED) display devices.

Recently, a display device including a quantum dot layer (e.g., an optical filter) and a color filter has been developed. The display device may include a substrate. A sub-pixel structure, a quantum dot layer, a partition wall structure surrounding the quantum dot layer, and a color filter may be formed on the substrate. In this case, the partition wall structure may be formed by using a photoresist, and the partition wall structure may further include a scattering material in order to increase a luminance of the display device. However, when the light blocking member further includes the scattering material, an alignment key formed on the substrate may not be recognized while an exposure process is performed to form an opening in the partition wall structure.

The above information disclosed in this Background section is only for understanding of the background of the inventive concepts, and, therefore, it may contain information that does not constitute prior art.

SUMMARY

Devices constructed according to illustrative implementations of the invention are capable of providing a display device manufactured using an alignment key, and methods according to illustrative implementations of the invention are capable of manufacturing a display device including an alignment key.

Additional features of the inventive concepts will be set forth in the description which follows, and in part will be apparent from the description, or may be learned by practice of the inventive concepts.

According to embodiments of the inventive concepts, a method of manufacturing a display device is provided as follows. A mother substrate including a first cell region, a second cell region, and a peripheral region is provided. First alignment keys arranged in a first direction in the peripheral region on the mother substrate is formed such that the first alignment keys are adjacent to a first side portion of each of first and second light emitting structures, while forming the first and second light emitting structures in the first and second cell regions on the mother substrate, respectively. A photoresist is formed in a second direction on the first and second light emitting structures by using a coater such that the photoresist does not to overlap the first alignment keys. The mother substrate is rotated at a preset angle. A light is irradiated to the photoresist by moving an exposer in a direction in which the first alignment keys are arranged.

In embodiments, the photoresist may include titanium oxide.

In embodiments, the method may further include forming second alignment keys, which are adjacent to a second side portion of each of the first and second light emitting structures, such that the second alignment keys oppose the first alignment keys, simultaneously with the forming of the first alignment keys.

In embodiments, the mother substrate may include first and second long sides extending in the first direction and first and second short sides extending in the second direction. The first alignment keys may be adjacent to the first long side of the mother substrate, and the second alignment keys may be adjacent to the second long side of the mother substrate.

In embodiments, each of the first and second light emitting structures may include first and second short sides extending in the first direction and adjacent to the first and second long sides of the mother substrate, respectively and first and second long sides extending in the second direction. The first long side of the first light emitting structure may be adjacent to the first short side of the mother substrate. The second long side of the second light emitting structure may be adjacent to the second short side of the mother substrate. The second long side of the first light emitting structure and the first long side of the second light emitting structure may be adjacent to each other.

In embodiments, the first and second side portions of each of the first and second light emitting structures may correspond to the first and second short sides of each of the first and second light emitting structures, respectively.

In embodiments, the method may further include positioning a mask on the photoresist by using the first and second alignment keys, before the irradiating of the light to the photoresist.

In embodiments, a width of the mask in the direction in which the first alignment keys are arranged may be smaller than a width of each of the first and second light emitting structures in the direction in which the first alignment keys are arranged.

In embodiments, the positioning of the mask on the photoresist may include positioning the mask such that the mask overlaps a first portion of the first light emitting structure on the photoresist, positioning the mask such that the mask overlaps a second portion of the first light emitting structure by moving the mask in the direction in which the first alignment keys are arranged, positioning the mask such that the mask overlaps a first portion of the second light emitting structure on the photoresist by moving the mask in the direction in which the first alignment keys are arranged, and positioning the mask such that the mask overlaps a second portion of the second light emitting structure on the photoresist by moving the mask in the direction in which the first alignment keys are arranged.

In embodiments, the method may further include forming third alignment keys, which are adjacent to third and fourth side portions of each of the first and second light emitting structures, such that the third alignment keys surround the first and second light emitting structures together with the first and second alignment keys, simultaneously with the forming of the first alignment keys.

In embodiments, the third alignment keys may overlap the photoresist.

In embodiments, the method may further include forming a partition wall structure including first to third openings, after the irradiating of the light to the photoresist.

In embodiments, each of the first to third openings may include a long side and a short side, and a direction in which the long side extends may be identical to the direction in which the first alignment keys are arranged.

In embodiments, after the forming of the partition wall structure, the method may further include forming first and second quantum dot layers and a scattering layer in the first to third openings, respectively and forming first to third color filters on the first and second quantum dot layers and the scattering layer, respectively.

In embodiments, the coater and the exposer may move only in the second direction.

In embodiments, when the mother substrate is rotated at the preset angle, the first alignment keys may be defined as being arranged in the second direction.

In embodiments, the first cell region and the second cell region may be spaced apart from each other in the first direction, and the peripheral region may surround the first and second cell regions.

According to embodiments of the inventive concepts, a method of manufacturing a display device is provided as follows. A mother substrate including a first cell region, a second cell region, and a peripheral region is provided. First alignment keys arranged in a first direction is formed in the peripheral region on the mother substrate such that the first alignment keys are adjacent to a first side portion of each of first and second light emitting structures, while forming the first and second light emitting structures in the first and second cell regions on the mother substrate, respectively. A photoresist is formed in a second direction on the first and second light emitting structures by using a coater such that the photoresist does not to overlap the first alignment keys. A light is irradiated to the photoresist by moving an exposer in the first direction.

In embodiments, the method may further include forming second alignment keys, which are adjacent to a second side portion of each of the first and second light emitting structures, such that the second alignment keys oppose the first alignment keys, simultaneously with the forming of the first alignment keys. The photoresist may include titanium oxide.

In embodiments, before the irradiating of the light to the photoresist, the method may further include positioning a mask such that the mask overlaps a first portion of the first light emitting structure on the photoresist, positioning the mask such that the mask overlaps a second portion of the first light emitting structure by moving the mask in the first direction, positioning the mask such that the mask overlaps a first portion of the second light emitting structure on the photoresist by moving the mask in the first direction, and positioning the mask such that the mask overlaps a second portion of the second light emitting structure on the photoresist by moving the mask in the first direction.

According to the method of manufacturing the display device of the embodiments of the inventive concepts, even when the photoresist includes titanium dioxide, the photoresist may not overlap the first and second alignment keys, so that the first and second alignment keys may be easily recognized in the mask alignment process that will be subsequently performed. Accordingly, an amount of the titanium dioxide may be increased in the photoresist, so that the luminance of the display device may be further increased.

In addition, the direction in which the exposer moves may be identical to the direction in which each of the long side of the first opening, the long side of the second opening, and the long side of the third opening extends, so that a residual film may not be generated in the first opening, the second opening, and the third opening after the development process.

Further, the direction in which the exposer moves may be identical to a direction in which the first light emitting structure and the second light emitting structure are arranged, so that the exposure process may be performed in one pass, and thus a process time may be relatively reduced.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION OF THE EMBODIMENTS

Figure 1:
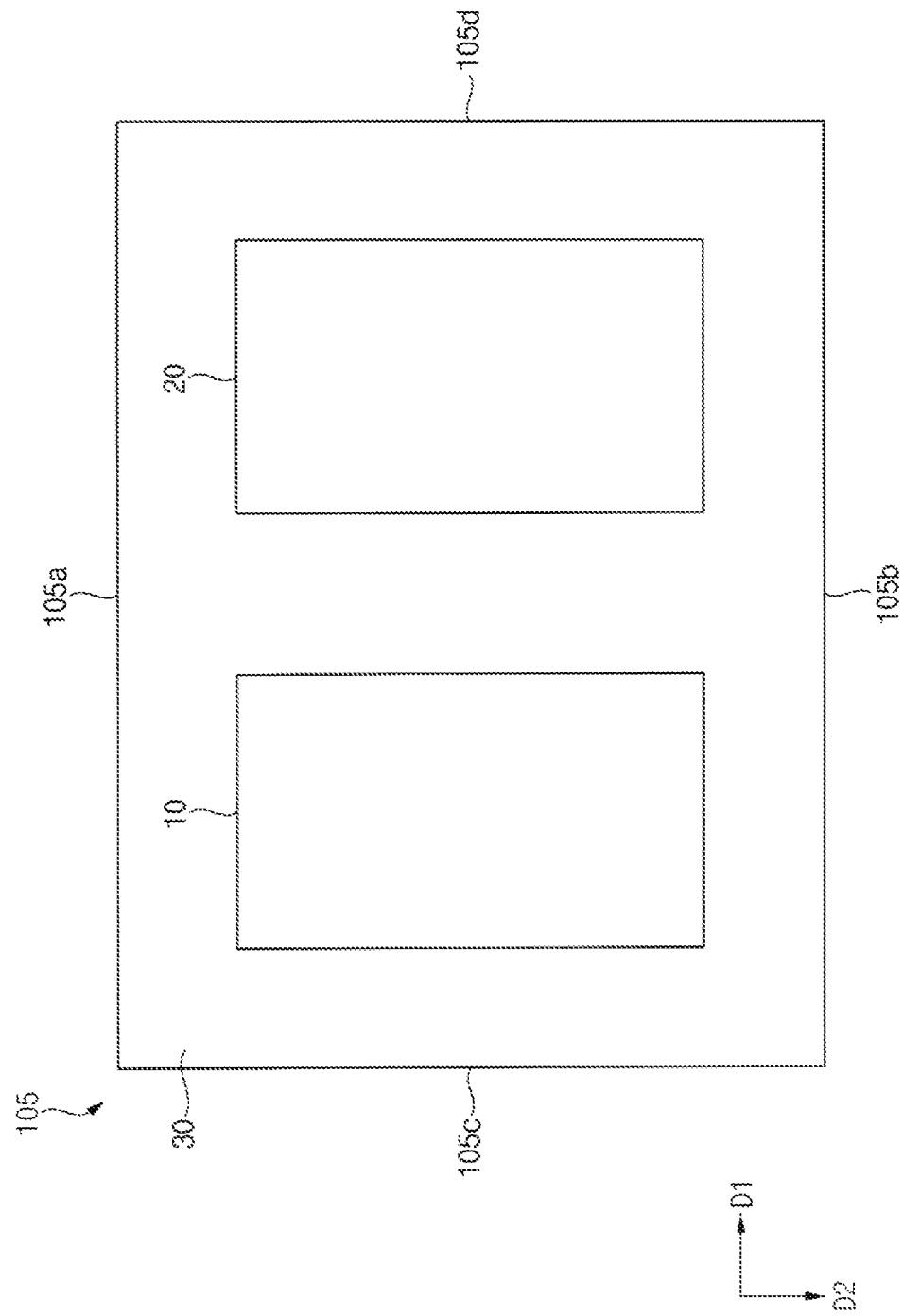
FIGS. 1, 2, 3, 4, 5, 6, 7, 8, 9, 10, 11, 12, 13, 14, 15, 16, 17, and 18 are views showing a method of manufacturing a display device according to embodiments of the inventive concepts.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIGS. 1 to 18 are views showing a method of manufacturing a display device according to embodiments of the present disclosure.

FIG. 1 is a plan view for describing a first cell region 10, a second cell region 20, and a peripheral region 30 of a mother substrate 105.

Referring to FIG. 1, the mother substrate 105 including a first cell region 10, a second cell region 20, and a peripheral region 30 may be provided. In this case, the first cell region 10 and the second cell region 20 may be spaced apart from each other, and the peripheral region 30 may surround the first cell region 10 and the second cell region 20.

The mother substrate 105 may include a first long side 105a, a second long side 105b, a first short side 105c, and a second short side 105d. For example, the first long side 105a and the second long side 105b may oppose each other, and each of the first long side 105a and the second long side 105b may extend in a first direction D1. In other words, the first long side 105a and the second long side 105b may be substantially parallel to each other. In addition, the first short side 105c and the second short side 105d may oppose each other, and each of the first short side 105c and the second short side 105d may extend in a second direction D2. In other words, the first short side 105c and the second short side 105d may be substantially parallel to each other. In this case, the first direction D1 and the second direction D2 may be substantially orthogonal to each other. That is, the mother substrate 105 may have a rectangular shape when viewed in a plan view.

The first cell region 10 and the second cell region 20 may be spaced apart from each other in the first direction D1. Each of the first cell region 10 and the second cell region 20 may have a rectangular shape when viewed in a plan view. In other words, each of the first cell region 10 and the second cell region 20 may include first and second long sides and first and second short sides. For example, the first and second long sides of each of the first cell region 10 and the second cell region 20 may extend in the second direction D2, and may oppose each other. In addition, the first and second short sides of each of the first cell region 10 and the second cell region 20 may extend in the first direction D1, and may oppose each other.

The first and second long sides of each of the first cell region 10 and the second cell region 20 may be substantially parallel to each other, and the first and second short sides of each of the first cell region 10 and the second cell region 20 may be substantially parallel to each other. In other words, the first and second long sides of each of the first cell region 10 and the second cell region 20 may be substantially parallel to the first short side 105c and the second short side 105d of the mother substrate 105, and the first and second short sides of each of the first cell region 10 and the second cell region 20 may be substantially parallel to the first long side 105a and the second long side 105b of the mother substrate 105.

The first short side of each of the first cell region 10 and the second cell region 20 may be adjacent to the first long side 105a of the mother substrate 105, and the second short side of each of the first cell region 10 and the second cell region 20 may be adjacent to the second long side 105b of the mother substrate 105. In addition, the first long side of the first cell region 10 may be adjacent to the first short side 105c of the mother substrate 105, and the second long side of the second cell region 20 may be adjacent to the second short side 105d of the mother substrate 105. Furthermore, the second long side of the first cell region 10 and the first long side of the second cell region 20 may be adjacent to each other, and may face each other.

The mother substrate 105 may be formed by using at least one of a quartz substrate, a synthetic quartz substrate, a calcium fluoride substrate, a fluorine-doped quartz substrate (F-doped quartz substrate), a soda lime glass substrate, a non-alkali glass substrate, and a tempered glass substrate.

According to embodiments, a display panel may be formed in the first cell region 10 and the second cell region 20 through a manufacturing process of the display device. In this case, two display panels may be formed on one mother substrate 105. For example, the display panel may correspond to a large display panel. In order to manufacture the display panel, first and second cell regions 10 and 20 including long sides in the second direction D2 have to be defined in the mother substrate 105.

However, although two cell regions have been described as being defined in the mother substrate 105 according to an embodiment, embodiments are not limited thereto. For example, when an area of the mother substrate 105 is increased in the first direction D1, additional cell regions may be arranged in the first direction D1.

Figure 2:
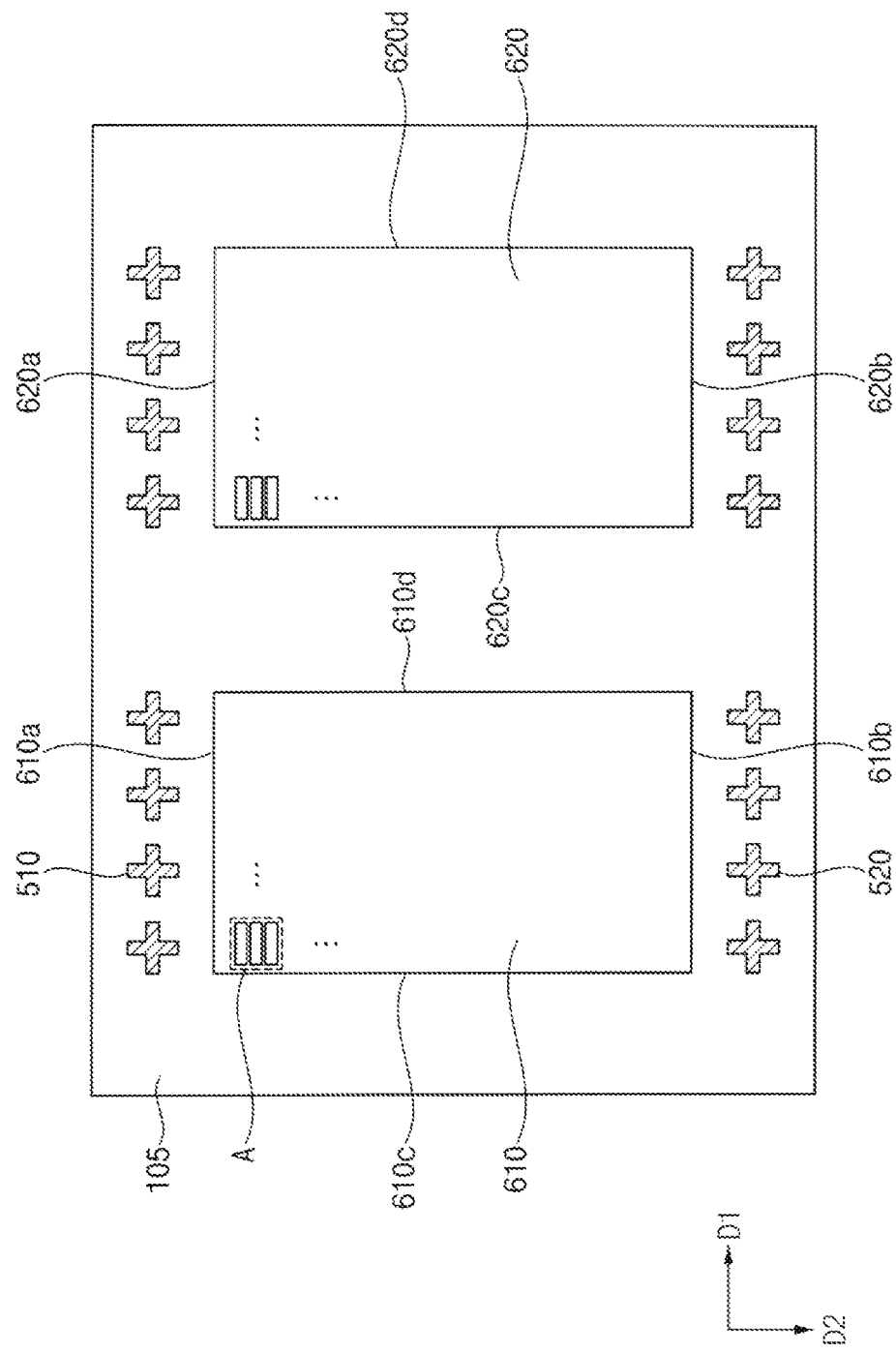
Figure 3:
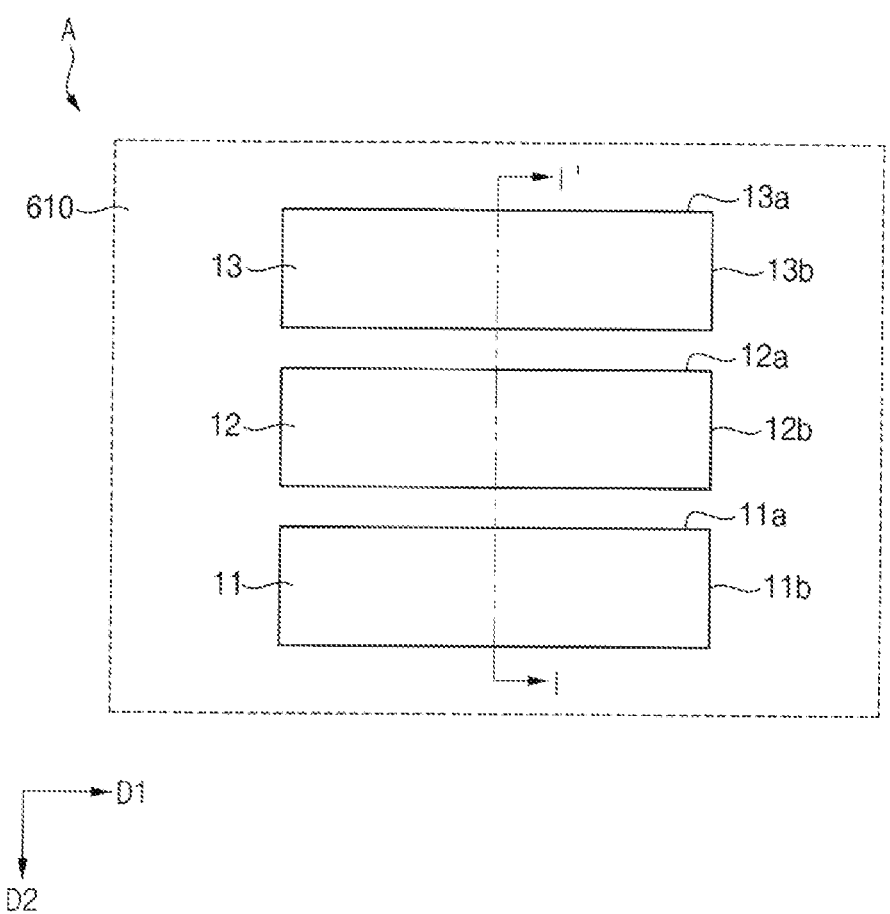

FIG. 2 is a plan view for describing first and second light emitting structures formed in the first cell region 10 and the second cell region 20 on the mother substrate 105, respectively, and first and second alignment keys 510 and 520 formed in the peripheral region 30. FIG. 3 is a partially enlarged plan view showing a region A of FIG. 2.

Referring to FIGS. 2 and 3, a first light emitting structure 610 may be formed in the first cell region 10 on the mother substrate 105, and a second light emitting structure 620 may be formed in the second cell region 20 on the mother substrate 105.

The first light emitting structure 610 and the second light emitting structure 620 may include: first short sides 610a and 620a extending in the first direction D1 and adjacent to the first long side 105a of the mother substrate 105; second short sides 610b and 620b extending in the first direction D1 and adjacent to the second long side 105b of the mother substrate 105; and first and second long sides 610c, 610d, 620c, and 620d extending in the second direction D2. In this case, the first long side 610c of the first light emitting structure 610 may be adjacent to the first short side 105c of the mother substrate 105, and the second long side 620d of the second light emitting structure 620 may be adjacent to the second short side 105d of the mother substrate 105. In addition, the second long side 610d of the first light emitting structure 610 and the first long side 620c of the second light emitting structure 620 may be adjacent to each other.

Each of the first light emitting structure 610 and the second light emitting structure 620 may include first to third sub-pixel regions 11, 12, and 13, and first to third sub-pixel structures may be formed in the first to third sub-pixel regions 11, 12, and 13, respectively. According to the embodiments, the first sub-pixel region 11 may include a long side 11a and a short side 11b, and the long side 11a of the first sub-pixel region 11 may be substantially parallel to the first direction D1. In addition, the second sub-pixel region 12 may include a long side 12a and a short side 12b, and the long side 12a of the second sub-pixel region 12 may be substantially parallel to the first direction D1. Furthermore, the third sub-pixel region 13 may include a long side 13a and a short side 13b, and the long side 13a of the third sub-pixel region 13 may be substantially parallel to the first direction D1. In other words, each of the first sub-pixel region 11, the second sub-pixel region 12, and the third sub-pixel region 13 may have a rectangular shape when viewed in a plan view.

First alignment keys 510 and second alignment keys 520 may be formed in the peripheral region 30 of the mother substrate 105. The first alignment keys 510 may be adjacent to a first side portion of each of the first light emitting structure 610 and the second light emitting structure 620 (or the first short side of the first cell region 10 and the first short side of the second cell region 20), and may be arranged in the first direction D1. The second alignment keys 520 may be adjacent to a second side portion of each of the first light emitting structure 610 and the second light emitting structure 620 (or the second short side of the first cell region 10 and the second short side of the second cell region 20), and may be arranged in the first direction D1. In other words, the first alignment keys 510 may be adjacent to the first long side 105a of the mother substrate 105, and the second alignment keys 520 may be adjacent to the second long side 105b of the mother substrate 105. In this case, the first side portion of each of the first light emitting structure 610 and the second light emitting structure 620 may correspond to the first short side of each of the first light emitting structure 610 and the second light emitting structure 620, and the second side portion of each of the first light emitting structure 610 and the second light emitting structure 620 may correspond to the second short side of each of the first light emitting structure 610 and the second light emitting structure 620.

The first alignment keys 510 and the second alignment keys 520 may oppose each other, and may be substantially parallel to each other. Each of the first alignment keys 510 and the second alignment keys 520 may have a cross shape when viewed in a plan view.

According to the embodiments, the first alignment keys 510 and the second alignment keys 520 may be simultaneously formed while the first light emitting structure 610 and the second light emitting structure 620 are formed in the first cell region 10 and the second cell region 20 on the mother substrate 105, respectively.

However, although each of the first alignment keys 510 and the second alignment keys 520 according to an embodiment has been shown as having a cross shape when viewed in a plan view, embodiments are not limited thereto. For example, each of the first alignment keys 510 and the second alignment keys 520 may have a triangular shape, a rhombic shape, a rectangular shape, a polygonal shape, a track shape, a circular shape, or an elliptical shape when viewed in a plan view.

In addition, although eight first alignment keys 510 and eight second alignment keys 520 according to an embodiment have been shown, embodiments are not limited thereto. For example, the number of the first alignment keys 510 and the number of the second alignment keys 520 may vary according to a size of each of the first light emitting structure 610 and the second light emitting structure 620 or a size of a mask 630 that will be described in FIG. 9.

Figure 4:
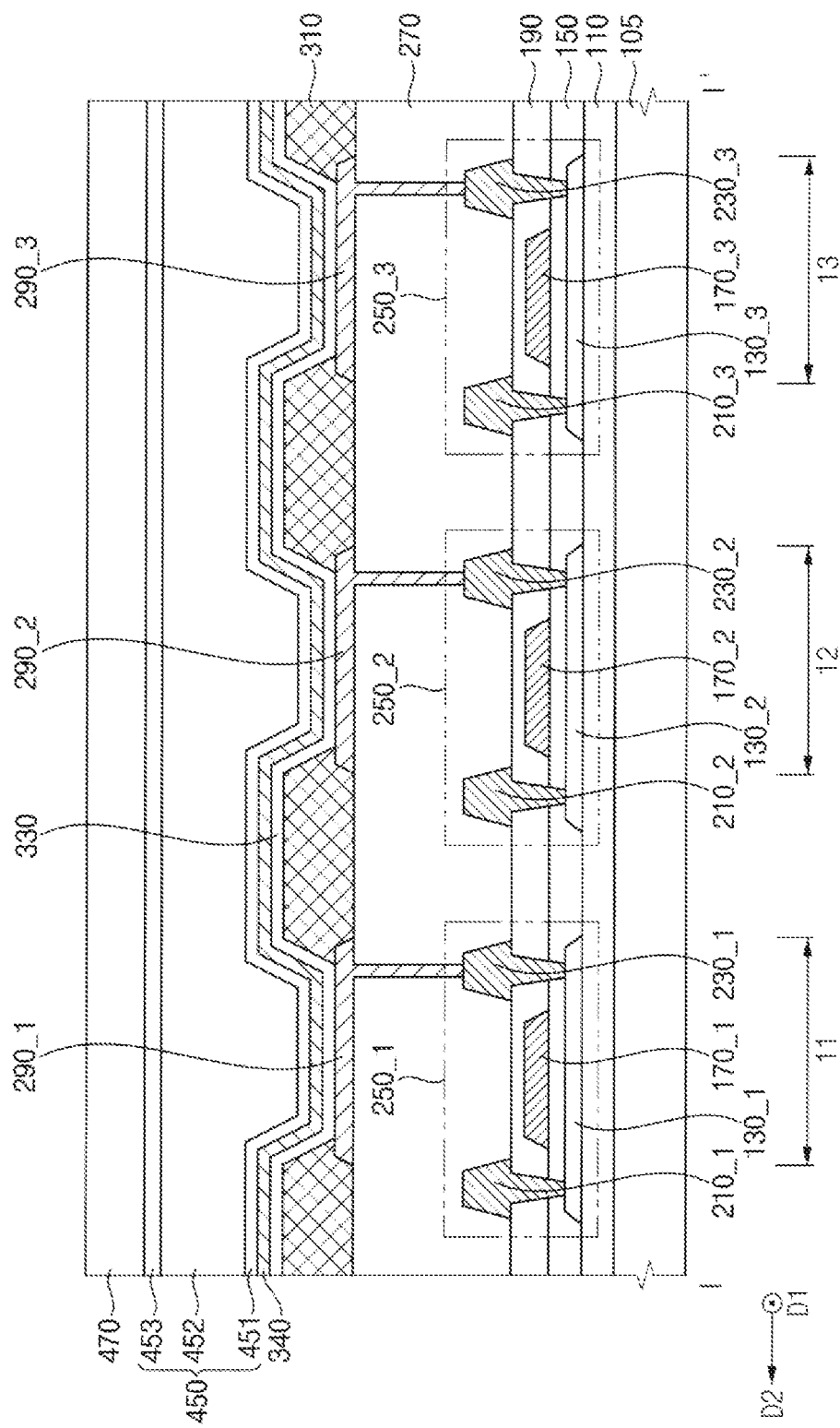

FIG. 4 is a sectional view taken along line I-I' of FIG. 3.

Referring to FIG. 4, a substrate 110 may be formed on the mother substrate 105. The substrate 110 may be configured as a transparent resin substrate having flexibility. Examples of the transparent resin substrate that may be used as the substrate 110 include a polyimide substrate. In this case, the polyimide substrate may have a stacked structure including a first polyimide layer, a barrier film layer, a second polyimide layer, and the like. In this case, after a semiconductor element and a sub-pixel structure are formed, the mother substrate 105 may be removed from the substrate 110. According to other embodiments, the mother substrate 105 may function as the substrate 110. In this case, the substrate 110 may not be formed.

A buffer layer may be formed on the substrate 110. The buffer layer may be formed over the whole substrate 110. The buffer layer may prevent metal atoms or impurities from diffusing from the substrate 110 to the semiconductor element and the sub-pixel structure, and may control a heat transfer rate during a crystallization process for forming an active layer to obtain a substantially uniform active layer. In addition, when a surface of the substrate 110 is not uniform, the buffer layer may serve to improve flatness of the surface of the substrate 110. Depending on a type of the substrate 110, at least two buffer layers may be provided on the substrate 110, or the buffer layers may not be provided. For example, the buffer layer may be formed by using an organic insulating material or an inorganic insulating material.

First, second, and third active layers 130_1, 130_2, and 130_3 may be formed on the substrate 110 while being spaced apart from each other. For example, the first active layer 130_1 may be formed on the substrate 110 to overlap the first sub-pixel region 11, the second active layer 130_2 may be formed on the substrate 110 to overlap the second sub-pixel region 12, and the third active layer 130_3 may be formed on the substrate 110 to overlap the third sub-pixel region 13. Each of the first to third active layers 130_1, 130_2, and 130_3 may be formed by using a metal oxide semiconductor, an inorganic semiconductor (e.g., amorphous silicon or polysilicon), an organic semiconductor, or the like. In other words, the first to third active layers 130_1, 130_2, and 130_3 may be simultaneously formed on the same layer by using the same material. In addition, each of the first to third active layers 130_1, 130_2, and 130_3 may include a source region and a drain region.

A gate insulating layer 150 may be formed on the first to third active layers 130_1, 130_2, and 130_3. The gate insulating layer 150 may cover the first to third active layers 130_1, 130_2, and 130_3 on the substrate 110, and may be formed over the whole substrate 110. For example, the gate insulating layer 150 may sufficiently cover the first to third active layers 130_1, 130_2, and 130_3 on the substrate 110, and may have a substantially flat top surface without creating a step around the first to third active layers 130_1, 130_2, and 130_3. In some embodiments, the gate insulating layer 150 may be formed along a profile of the first to third active layers 130_1, 130_2, and 130_3 with a uniform thickness to cover the first to third active layers 130_1, 130_2, and 130_3 on the substrate 110. The gate insulating layer 150 may be formed by using a silicon compound, metal oxide, or the like. For example, the gate insulating layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like. According to other embodiments, the gate insulating layer 150 may have a multilayer structure including a plurality of insulating layers. For example, the insulating layers may have mutually different thicknesses, or may include mutually different materials.

First, second, and third gate electrodes 170_1, 170_2, and 170_3 may be formed on the gate insulating layer 150 while being spaced apart from each other. For example, the first gate electrode 170_1 may be formed on a portion of the gate insulating layer 150 under which the first active layer 130_1 is located to overlap the first sub-pixel region 11, the second gate electrode 170_2 may be formed on a portion of the gate insulating layer 150 under which the second active layer 130_2 is located to overlap the second sub-pixel region 12, and the third gate electrode 170_3 may be formed on a portion of the gate insulating layer 150 under which the third active layer 130_3 is located to overlap the third sub-pixel region 13. Each of the first to third gate electrodes 170_1, 170_2, and 170_3 may be formed by using a metal, an alloy, metal nitride, conductive metal oxide, a transparent conductive material, or the like. For example, each of the first to third gate electrodes 170_1, 170_2, and 170_3 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like. These may be used alone or in combination with each other. In other words, the first to third gate electrodes 170_1, 170_2, and 170_3 may be simultaneously formed on the same layer by using the same material. According to other embodiments, each of the first to third gate electrodes 170_1, 170_2, and 170_3 may have a multilayer structure including a plurality of metal layers. For example, the metal layers may have mutually different thicknesses, or may include mutually different materials.

An interlayer insulating layer 190 may be formed on the first to third gate electrodes 170_1, 170_2, and 170_3. The interlayer insulating layer 190 may cover the first to third gate electrodes 170_1, 170_2, and 170_3 on the gate insulating layer 150, and may be formed over the whole gate insulating layer 150. For example, the interlayer insulating layer 190 may sufficiently cover the first to third gate electrodes 170_1, 170_2, and 170_3 on the gate insulating layer 150, and may have a substantially flat top surface without creating a step around the first to third gate electrodes 170_1, 170_2, and 170_3. In some embodiments, the interlayer insulating layer 190 may be formed along a profile of the first to third gate electrodes 170_1, 170_2, and 170_3 with a uniform thickness to cover the first to third gate electrodes 170_1, 170_2, and 170_3 on the gate insulating layer 150. The interlayer insulating layer 190 may be formed by using a silicon compound, metal oxide, or the like. According to other embodiments, the interlayer insulating layer 190 may have a multilayer structure including a plurality of insulating layers. For example, the insulating layers may have mutually different thicknesses, or may include mutually different materials.

A first source electrode 210_1, a first drain electrode 230_1, a second source electrode 210_2, a second drain electrode 230_2, a third source electrode 210_3, and a third drain electrode 230_3 may be formed on the interlayer insulating layer 190 while being spaced apart from each other. For example, the first source electrode 210_1 may be connected to the source region of the first active layer 130_1 through a contact hole formed by removing first portions of the gate insulating layer 150 and the interlayer insulating layer 190 that at least partially overlap the first sub-pixel region 11, and the first drain electrode 230_1 may be connected to the drain region of the first active layer 130_1 through a contact hole formed by removing second portions of the gate insulating layer 150 and the interlayer insulating layer 190 that at least partially overlap the first sub-pixel region 11. In addition, the second source electrode 210_2 may be connected to the source region of the second active layer 130_2 through a contact hole formed by removing third portions of the gate insulating layer 150 and the interlayer insulating layer 190 that at least partially overlap the second sub-pixel region 12, and the second drain electrode 230_2 may be connected to the drain region of the second active layer 130_2 through a contact hole formed by removing fourth portions of the gate insulating layer 150 and the interlayer insulating layer 190 that at least partially overlap the second sub-pixel region 12. Furthermore, the third source electrode 210_3 may be connected to the source region of the third active layer 130_3 through a contact hole formed by removing fifth portions of the gate insulating layer 150 and the interlayer insulating layer 190 that at least partially overlap the third sub-pixel region 13, and the third drain electrode 230_3 may be connected to the drain region of the third active layer 130_3 through a contact hole formed by removing sixth portions of the gate insulating layer 150 and the interlayer insulating layer 190 that at least partially overlap the third sub-pixel region 13. Each of the first to third source electrodes 210_1, 210_2, and 210_3 and the first to third drain electrodes 230_1, 230_2, and 230_3 may be formed by using a metal, an alloy, metal nitride, conductive metal oxide, a transparent conductive material, or the like. These may be used alone or in combination with each other. In other words, the first to third source electrodes 210_1, 210_2, and 210_3 and the first to third drain electrodes 230_1, 230_2, and 230_3 may be simultaneously formed on the same layer by using the same material. According to other embodiments, each of the first to third source electrodes 210_1, 210_2, and 210_3 and the first to third drain electrodes 230_1, 230_2, and 230_3 may have a multilayer structure including a plurality of metal layers. For example, the metal layers may have mutually different thicknesses, or may include mutually different materials.

Accordingly, a first semiconductor element 250_1 including the first active layer 130_1, the first gate electrode 170_1, the first source electrode 210_1, and the first drain electrode 230_1, and at least partially overlapping the first sub-pixel region 11 may be formed, a second semiconductor element 250_2 including the second active layer 130_2, the second gate electrode 170_2, the second source electrode 210_2, and the second drain electrode 230_2, and at least partially overlapping the second sub-pixel region 12 may be formed, and a third semiconductor element 250_3 including the third active layer 130_3, the third gate electrode 170_3, the third source electrode 210_3, and the third drain electrode 230_3, and at least partially overlapping the third sub-pixel region 13 may be formed.

According to the embodiments, the first alignment keys 510 and the second alignment keys 520 may be simultaneously formed in a process of forming the first to third active layers 130_1, 130_2, and 130_3, the first to third gate electrodes 170_1, 170_2, and 170_3, the first, second, and third source electrodes 210_1, 210_1, and 210_3, and the first, second, and third drain electrodes 230_1, 230_2, and 230_3. In other words, the first alignment keys 510 and the second alignment keys 520 may be formed simultaneously with the first to third active layers 130_1, 130_2, and 130_3, the first to third gate electrodes 170_1, 170_2, and 170_3, the first, second, and third source electrodes 210_1, 210_1, and 210_3, or the first, second, and third drain electrodes 230_1, 230_2, and 230_3 by using the same material as the first to third active layers 130_1, 130_2, and 130_3, the first to third gate electrodes 170_1, 170_2, and 170_3, the first, second, and third source electrodes 210_1, 210_1, and 210_3, or the first, second, and third drain electrodes 230_1, 230_2, and 230_3.

A planarization layer 270 may be formed on the interlayer insulating layer 190 and the first to third semiconductor elements 250_1, 250_2, and 250_3. For example, the planarization layer 270 may have a relatively thick thickness to sufficiently cover the first to third source electrodes 210_1, 210_2, and 210_3 and the first to third drain electrodes 230_1, 230_2, and 230_3 on the interlayer insulating layer 190. In this case, the planarization layer 270 may have a substantially flat top surface. In order to implement such a flat top surface of the planarization layer 270, a planarization process may be additionally performed on the planarization layer 270. The planarization layer 270 may include an organic insulating material, an inorganic insulating material, or the like. According to the embodiments, the planarization layer 270 may be formed by using an organic insulating material.

First to third lower electrodes 290_1, 290_2, and 290_3 may be formed on the planarization layer 270 while being spaced apart from each other. For example, the first lower electrode 290_1 may be formed in the first sub-pixel region 11, the second lower electrode 290_2 may be formed in the second sub-pixel region 12, and the third lower electrode 290_3 may be formed in the third sub-pixel region 13. Each of the first to third lower electrodes 290_1, 290_2, and 290_3 may pass through the planarization layer 270 so as to be connected to the first to third drain electrodes 230_1, 230_2, and 230_3, respectively. In other words, the first to third lower electrodes 290_1, 290_2, and 290_3 may be electrically connected to the first to third semiconductor elements 250_1, 250_2, and 250_3, respectively. Each of the first to third lower electrodes 290_1, 290_2, and 290_3 may be formed by using a metal, an alloy, metal nitride, conductive metal oxide, a transparent conductive material, or the like. These may be used alone or in combination with each other. In some embodiments, each of the first to third lower electrodes 290_1, 290_2, and 290_3 may have a multilayer structure including a plurality of metal layers. For example, the metal layers may have mutually different thicknesses, or may include mutually different materials.

A pixel defining layer 310 may be formed on a portion of each of the first to third lower electrodes 290_1, 290_2, and 290_3 and on the planarization layer 270. The pixel defining layer 310 may cover both side portions (e.g., outer peripheral portions) of each of the first to third lower electrodes 290_1, 290_2, and 290_3, and may expose a portion of a top surface of each of the first to third lower electrodes 290_1, 290_2, and 290_3. In other words, the pixel defining layer 310 may include a first opening, a second opening, and a third opening, which expose the portions of the top surfaces of the first to third lower electrodes 290_1, 290_2, and 290_3, respectively. The pixel defining layer 310 may be formed of an organic insulating material or an inorganic insulating material. According to the embodiments, the pixel defining layer 310 may be formed by using an organic insulating material. For example, the pixel defining layer 310 may include a photoresist, a polyacryl-based resin, a polyimide-based resin, a polyamide-based resin, a siloxane-based resin, an acryl-based resin, an epoxy-based resin, and the like.

A light emitting layer 330 may be formed on the pixel defining layer 310 and the top surface of each of the first to third lower electrodes 290_1, 290_2, and 290_3 exposed by the pixel defining layer 310. In other words, the light emitting layer 330 may be formed continuously and integrally on the substrate 110. According to the embodiments, the light emitting layer 330 may be formed by using a light emitting material for emitting a blue light. For example, since the light emitting layer 330 emits the blue light, a light loss rate of the blue light passing through a scattering layer 533 and emitted to an outside through a third color filter 513 may be relatively small. Therefore, the third opening 310c may be relatively small.

Alternatively, the light emitting layer 330 may be formed by stacking a plurality of light emitting materials for generating different color lights such as a red light, a green light, and a blue light to emit a white light as a whole.

An upper electrode 340 may be formed on the pixel defining layer 310 and the light emitting layer 330. The upper electrode 340 may be formed by using a metal, an alloy, metal nitride, conductive metal oxide, a transparent conductive material, or the like. These may be used alone or in combination with each other. According to other embodiments, the upper electrode 340 may have a multilayer structure including a plurality of metal layers. For example, the metal layers may have mutually different thicknesses, or may include mutually different materials.

Accordingly, a first sub-pixel structure including the first lower electrode 290_1, the light emitting layer 330, and the upper electrode 340 may be formed in the first sub-pixel region 11, a second sub-pixel structure including the second lower electrode 290_2, the light emitting layer 330, and the upper electrode 340 may be formed in the second sub-pixel region 12, and a third sub-pixel structure including the third lower electrode 290_3, the light emitting layer 330, and the upper electrode 340 may be formed in the third sub-pixel region 13.

A first inorganic thin film encapsulation layer 451 may be formed on the upper electrode 340. The first inorganic thin film encapsulation layer 451 may be formed along a profile of the upper electrode 340 with a uniform thickness to cover the upper electrode 340. The first inorganic thin film encapsulation layer 451 may prevent the first to third sub-pixel structures from deteriorating due to penetration of moisture, oxygen, and the like. In addition, the first inorganic thin film encapsulation layer 451 may perform a function of protecting the first to third sub-pixel structures from an external impact. The first inorganic thin film encapsulation layer 451 may be formed by using an inorganic insulating material having flexibility.

An organic thin film encapsulation layer 452 may be formed on the first inorganic thin film encapsulation layer 451. The organic thin film encapsulation layer 452 may improve flatness on the first inorganic thin film encapsulation layer 451, and may protect the first to third sub-pixel structures. The organic thin film encapsulation layer 452 may be formed by using an organic insulating material having flexibility.

A second inorganic thin film encapsulation layer 453 may be formed on the organic thin film encapsulation layer 452. The second inorganic thin film encapsulation layer 453 may be formed along a profile of the organic thin film encapsulation layer 452 with a uniform thickness to cover the organic thin film encapsulation layer 452. The second inorganic thin film encapsulation layer 453 may prevent the first to third sub-pixel structures from deteriorating due to the penetration of moisture, oxygen, and the like together with the first inorganic thin film encapsulation layer 451. In addition, the second inorganic thin film encapsulation layer 453 may perform a function of protecting the first to third sub-pixel structures from an external impact together with the first inorganic thin film encapsulation layer 451 and the organic thin film encapsulation layer 452. The second inorganic thin film encapsulation layer 453 may be formed by using the inorganic insulating material having flexibility.

Accordingly, a thin film encapsulation structure 450 including the first inorganic thin film encapsulation layer 451, the organic thin film encapsulation layer 452, and the second inorganic thin film encapsulation layer 453 may be formed. In some embodiments, the thin film encapsulation structure 450 may have a five-layer structure in which first to fifth thin film encapsulation layers are stacked or a seven-layer structure in which first to seventh thin film encapsulation layers are stacked.

A first capping layer 470 may be formed on the thin film encapsulation structure 450. The first capping layer 470 may protect the thin film encapsulation structure 450. The first capping layer 470 may be formed by using an organic insulating material or an inorganic insulating material. In some embodiments, the first capping layer 470 may be formed by using a high-hardness polymer material such as siloxane. According to other embodiments, the first capping layer 470 may not be formed. In this case, a photoresist 550 may be directly formed on the thin film encapsulation structure 450 (i.e., the second inorganic thin film encapsulation layer 453).

As described above, the first light emitting structure 610 and the second light emitting structure 620, each including the substrate 110, the gate insulating layer 150, the interlayer insulating layer 190, the first to third semiconductor elements 250_1, 250_2, and 250_3, the planarization layer 270, the first to third sub-pixel structures, the pixel defining layer 310, the thin film encapsulation structure 450, and the first capping layer 470, may be formed in the first cell region 10 and the second cell region 20 on the mother substrate 105.

Figure 5:
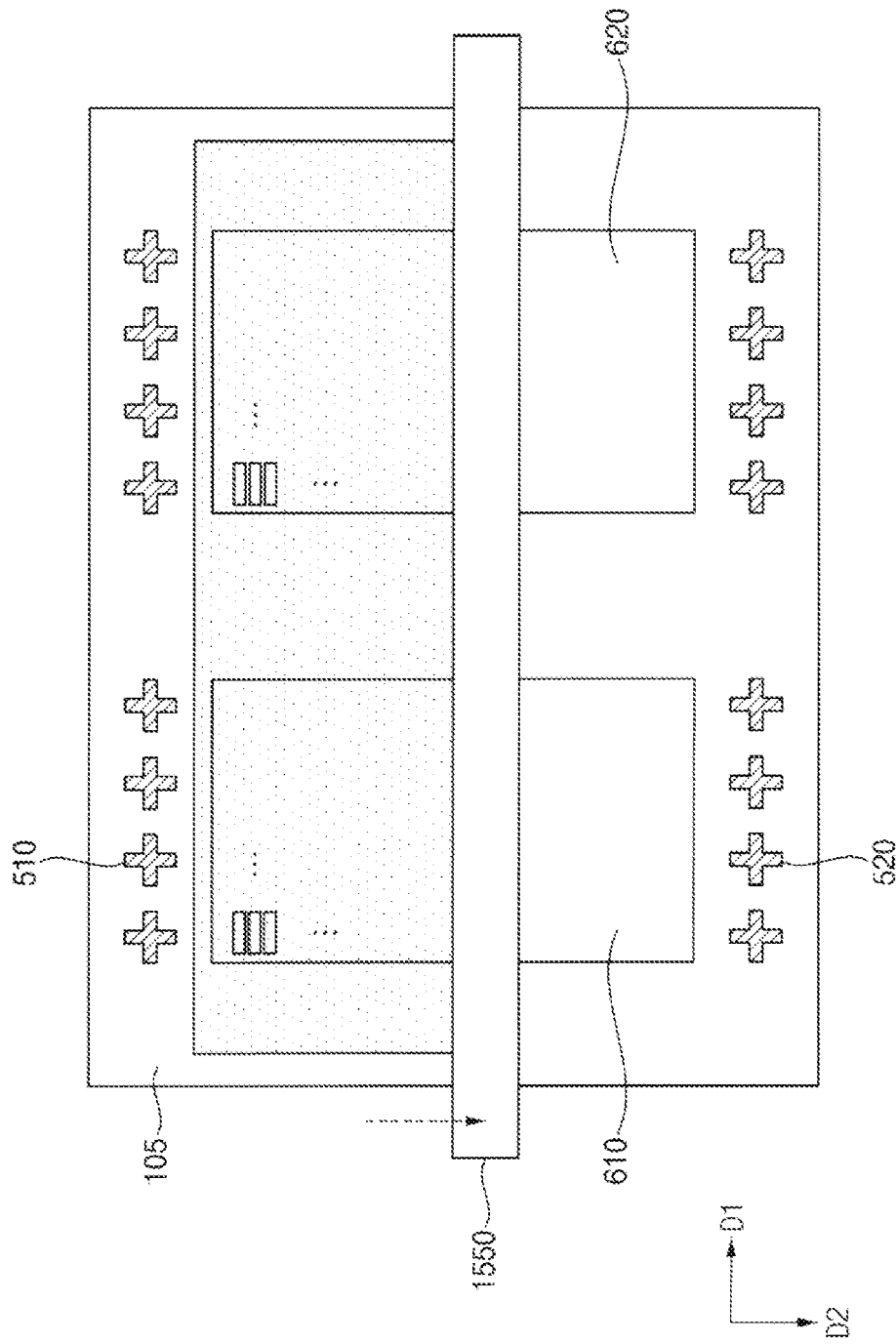
Figure 6:
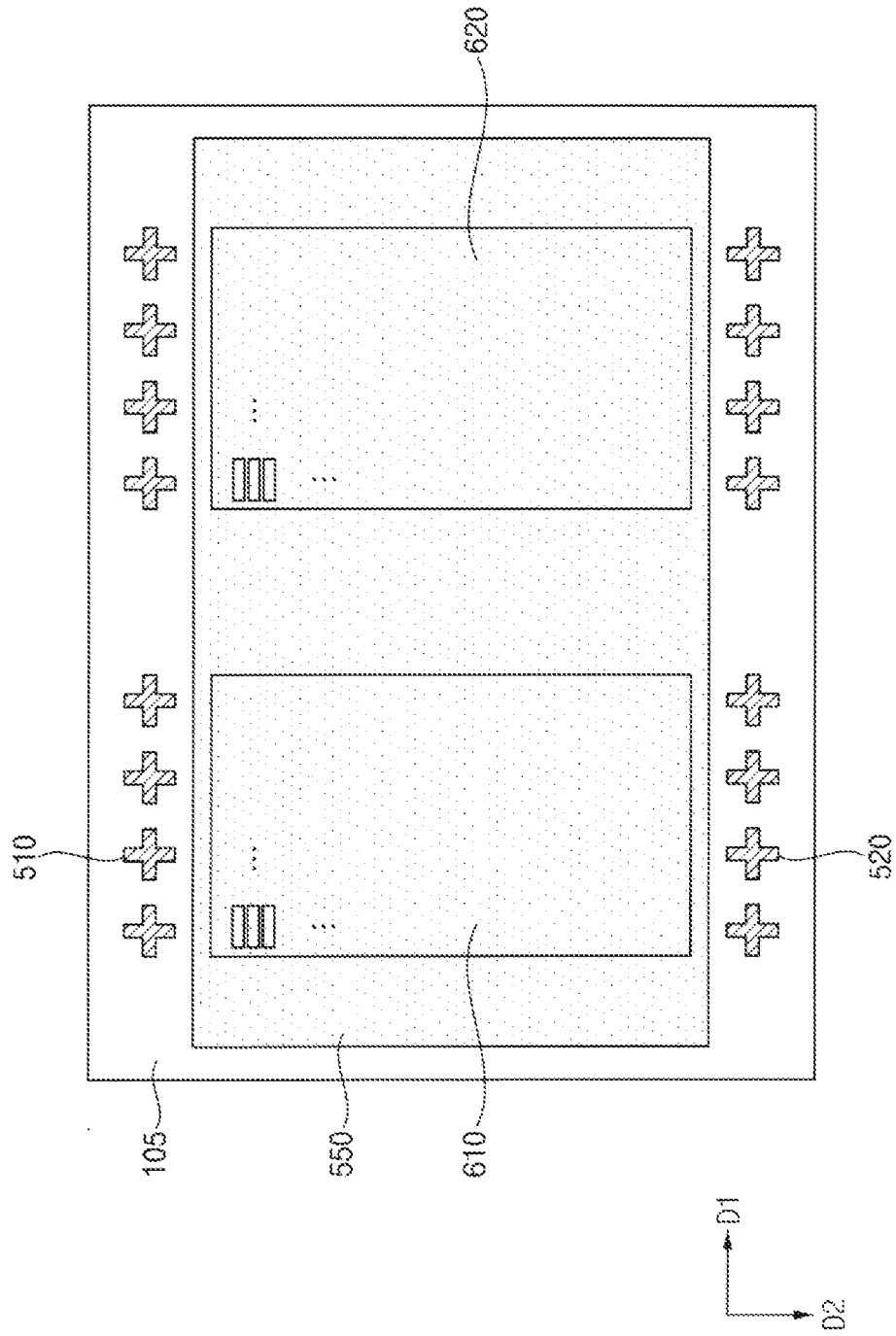
Figure 7:
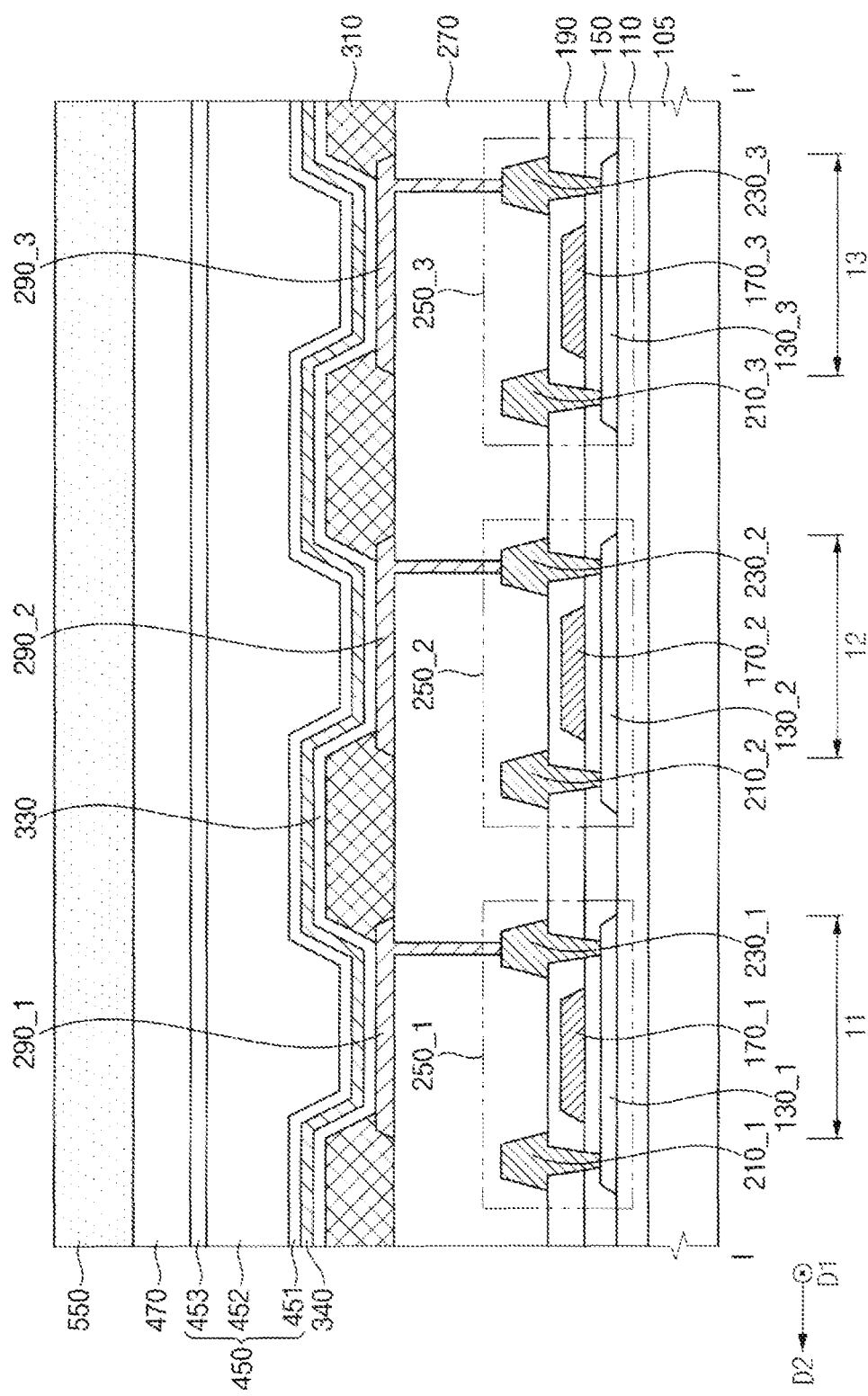

FIGS. 5 and 6 are plan views for describing a coater 1550 for forming a photoresist 550. FIG. 7 is a sectional view showing a state in which the photoresist 550 is formed on the first and second light emitting structures 610 and 620 of FIG. 4.

Referring to FIGS. 5, 6, and 7, a coater 1550 may be provided. The coater 1550 may perform coating with a photoresist, and the coater 1550 may move only in a vertical direction (e.g., the second direction D2) according to process conditions.

A photoresist 550 may be formed on the mother substrate 105 by using the coater 1550. The photoresist 550 may be formed in the second direction D2 on the first and second light emitting structures 610 and 620 (or the first capping layer 470) without overlapping the first alignment keys 510 and the second alignment keys 520. In other words, the photoresist 550 may be formed in the first cell region 10, the second cell region 20, and a portion of the peripheral region 30 surrounding the first and second cell regions 10 and 20, and may expose the first and second alignment keys 510 and 520.

The photoresist 550 may include titanium oxide (TiOx). According to the embodiments, the photoresist 550 may be a negative photoresist including titanium dioxide (TiO2). In some embodiments, the photoresist 550 may be a positive photoresist including titanium dioxide (TiO2). According to other embodiments, photoresist 550 may be substantially opaque, and may further include a light blocking material to absorb a light. In other words, the photoresist 550 may be a negative photoresist including titanium dioxide (TiO2) and the light blocking material. For example, the light-shielding material may include carbon black, titanium nitride oxide, titanium black, phenylene black, aniline black, cyanine black, nigrosine acid black, a black resin, and the like.

However, although the photoresist 550 according to an embodiment has been described as including a negative photoresist, embodiments are not limited thereto. For example, the photoresist 550 may include an organic material such as a polyacryl-based resin, a polyimide-based resin, a polyamide-based resin, a siloxane-based resin, an acryl-based resin, or an epoxy-based resin.

According to a conventional method of manufacturing a display device, a photoresist including titanium dioxide (TiO2) covers alignment keys. In this case, the alignment keys may not be recognized in a mask alignment process that will be subsequently performed, so that a defect may occur in an exposure process of irradiating a light to the photoresist.

According to the embodiments, even when the photoresist 550 includes titanium dioxide (TiO2), the photoresist 550 may not overlap the first and second alignment keys 510 and 520, so that the first and second alignment keys 510 and 520 may be easily recognized in a mask alignment process that will be subsequently performed.

Figure 8:
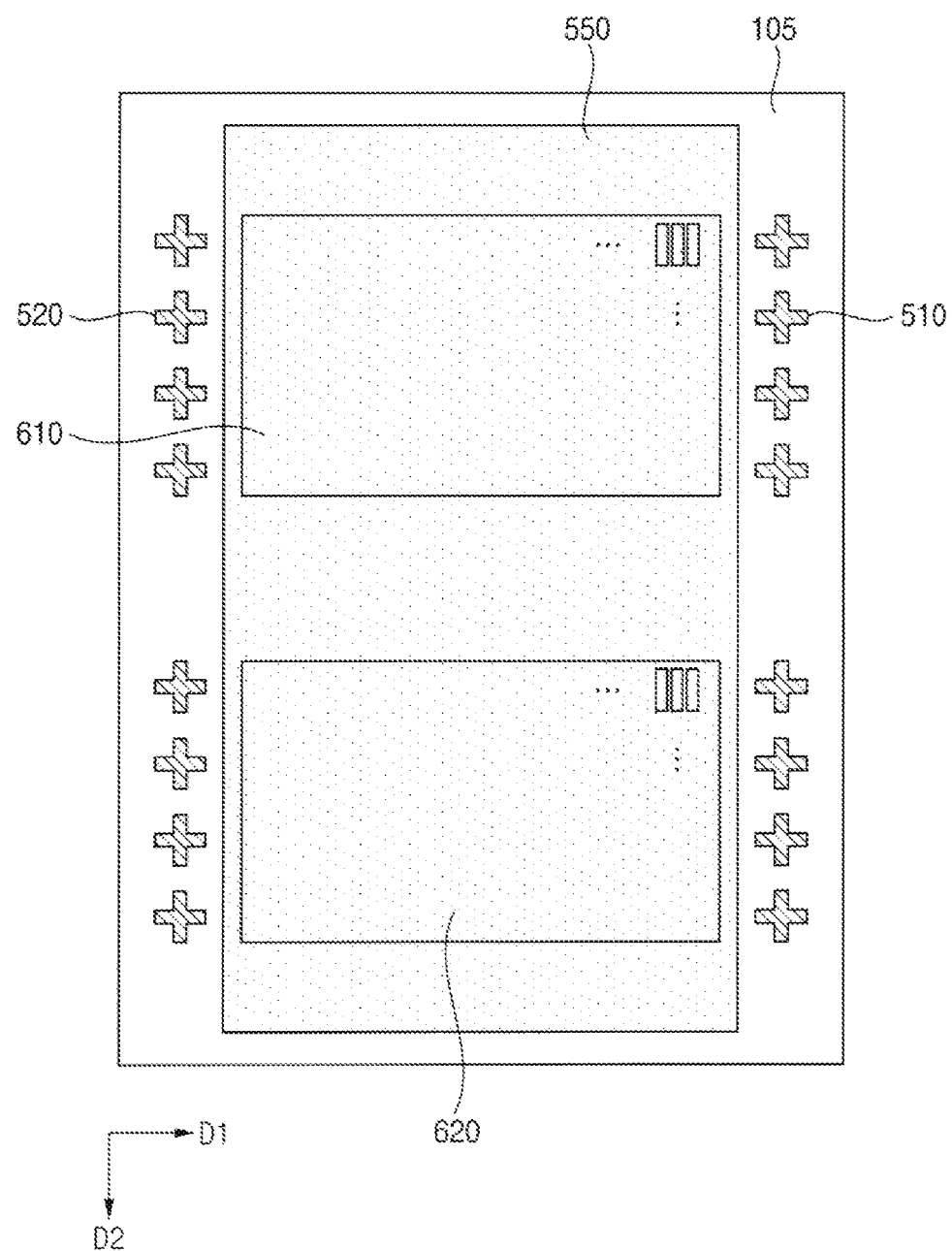

FIG. 8 is a plan view showing a state in which the mother substrate 105 of FIG. 6 is rotated at a preset angle.

Referring to FIG. 8, the mother substrate 105 on which the photoresist 550 is formed may be rotated at a preset angle by using a turntable. According to the embodiments, the preset angle may be approximately 90 degrees.

However, although the mother substrate 105 on which the photoresist 550 is formed according to an embodiment has been shown as being rotated by approximately 90 degrees in a clockwise direction, embodiments are not limited thereto. For example, when the first light emitting structure 610 and the second light emitting structure 620 are symmetrical with each other with respect to the first direction D1, the mother substrate 105 on which the photoresist 550 is formed may be rotated by approximately 90 degrees in a counterclockwise direction.

After the mother substrate 105 is rotated at the preset angle, each of the first alignment keys 510 and the second alignment keys 520 may be defined as being arranged in the second direction D2. In addition, after the mother substrate 105 is rotated at the preset angle, the first light emitting structure 610 and the second light emitting structure 620 may be defined as being spaced apart from each other in the second direction D2.

Figure 9:
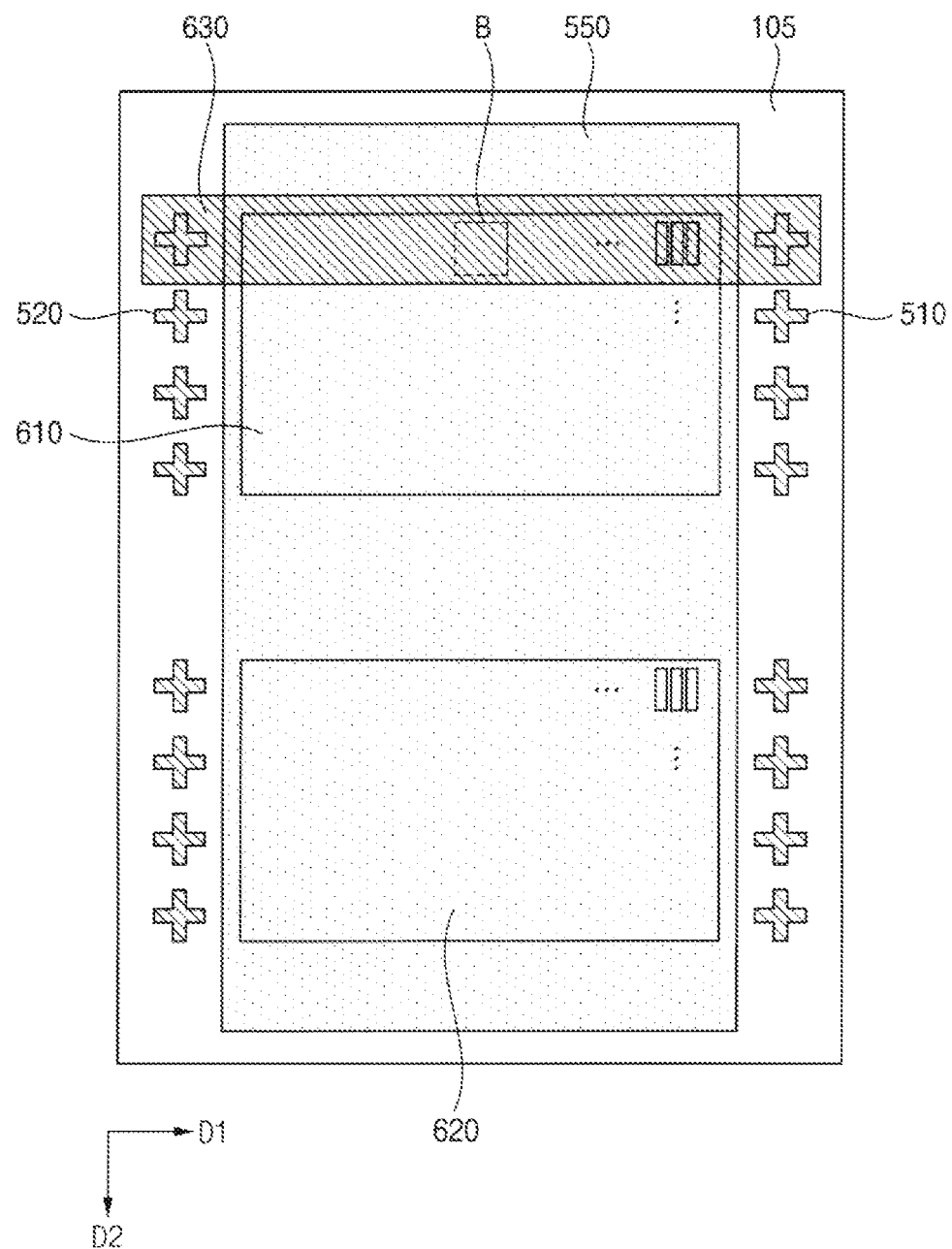
Figure 10:
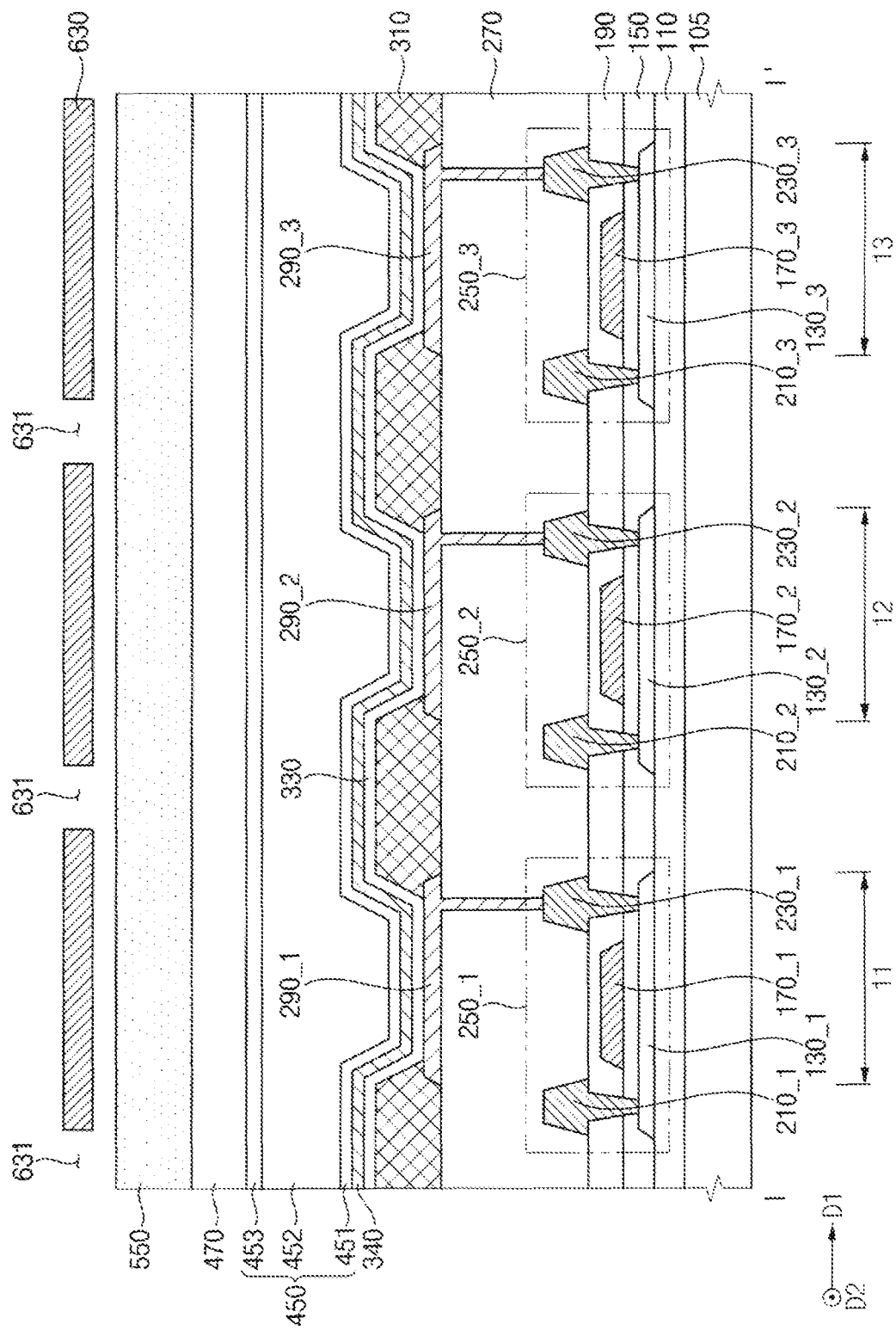

FIG. 9 is a plan view for describing a mask 630 located on the photoresist 550 of FIG. 8. FIG. 10 is a sectional view showing a state in which the mask 630 is located on the photoresist 550 of FIG. 7.

Referring to FIGS. 9 and 10, a mask 630 may be positioned on the photoresist 550 by using the first alignment keys 510 and the second alignment keys 520 (e.g., a mask alignment process). The mask 630 may include a plurality of openings 631. A width of the mask 630 in a direction in which the first and second alignment keys 510 and 520 are arranged (e.g., the second direction D2) may be smaller than a width of each of the first and second light emitting structures 610 and 620 in the second direction D2. For example, the mask 630 may partially overlap the first light emitting structure 610 or the second light emitting structure 620. The mask 630 may include a metal material. For example, the mask 630 may be formed by using steel use stainless (SUS).

According to the embodiments, the mask 630 may be positioned such that the mask 630 may overlap a first portion of the first light emitting structure 610 on the photoresist 550. Except for the first portion where the mask 630 is positioned, a light blocking member for blocking a light may be located in the remaining portion.

Figure 11:
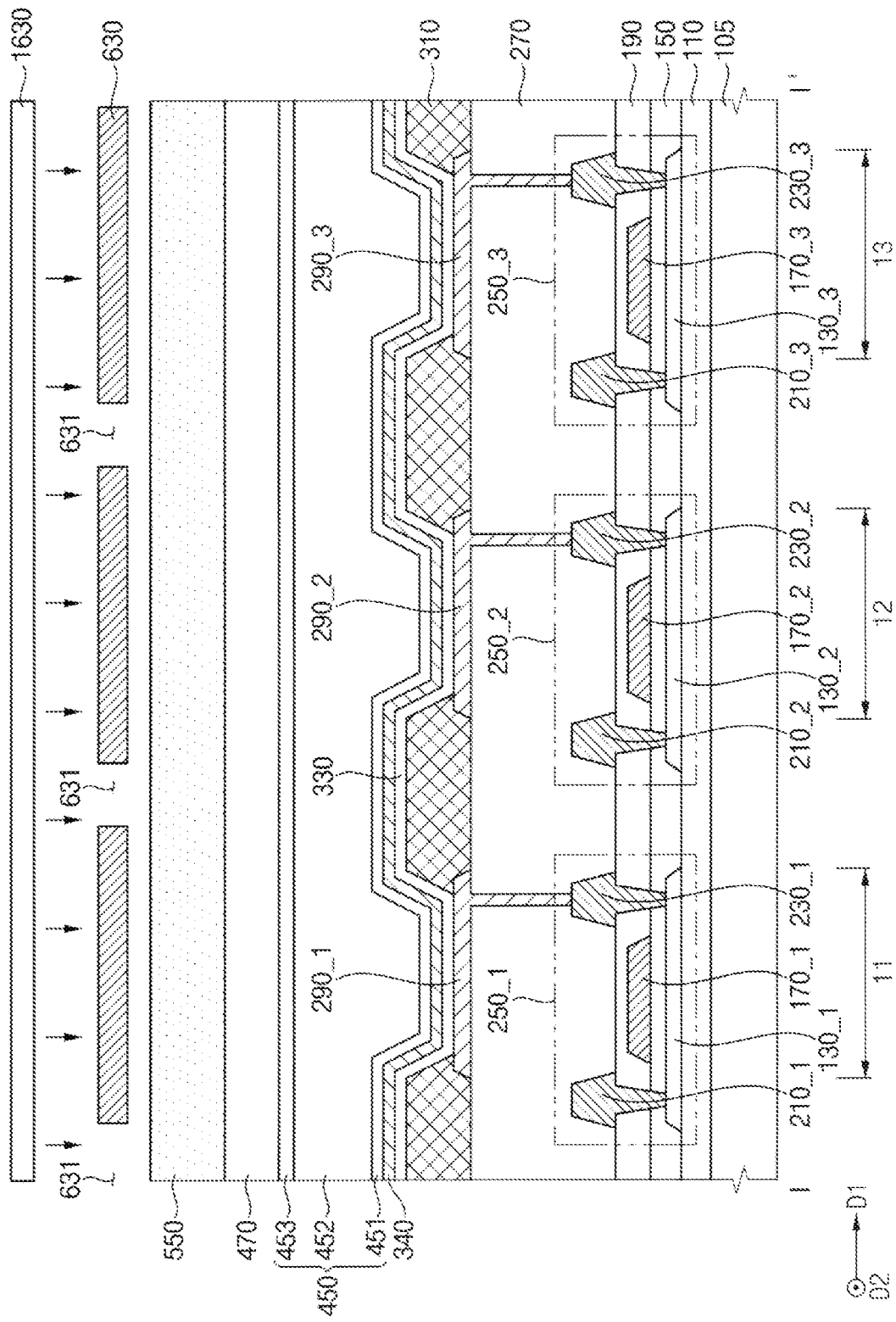

FIG. 11 is a sectional view for describing an exposer 1630.

Referring to FIG. 11, an exposer 1630 may be provided. The exposer 1630 may emit a light, and the exposer 1630 may move only in the vertical direction (e.g., the second direction D2 or the direction in which the first and second alignment keys 510 and 520 are arranged) according to process conditions.

The exposer 1630 may be placed on the mask 630 that overlaps the first portion of the first light emitting structure 610. After the exposer 1630 is placed on the mask 630, a light may be emitted from the exposer 1630. The emitted light may be irradiated to the photoresist 550 located under the opening 631 through the opening 631 of the mask 630.

Figure 12:
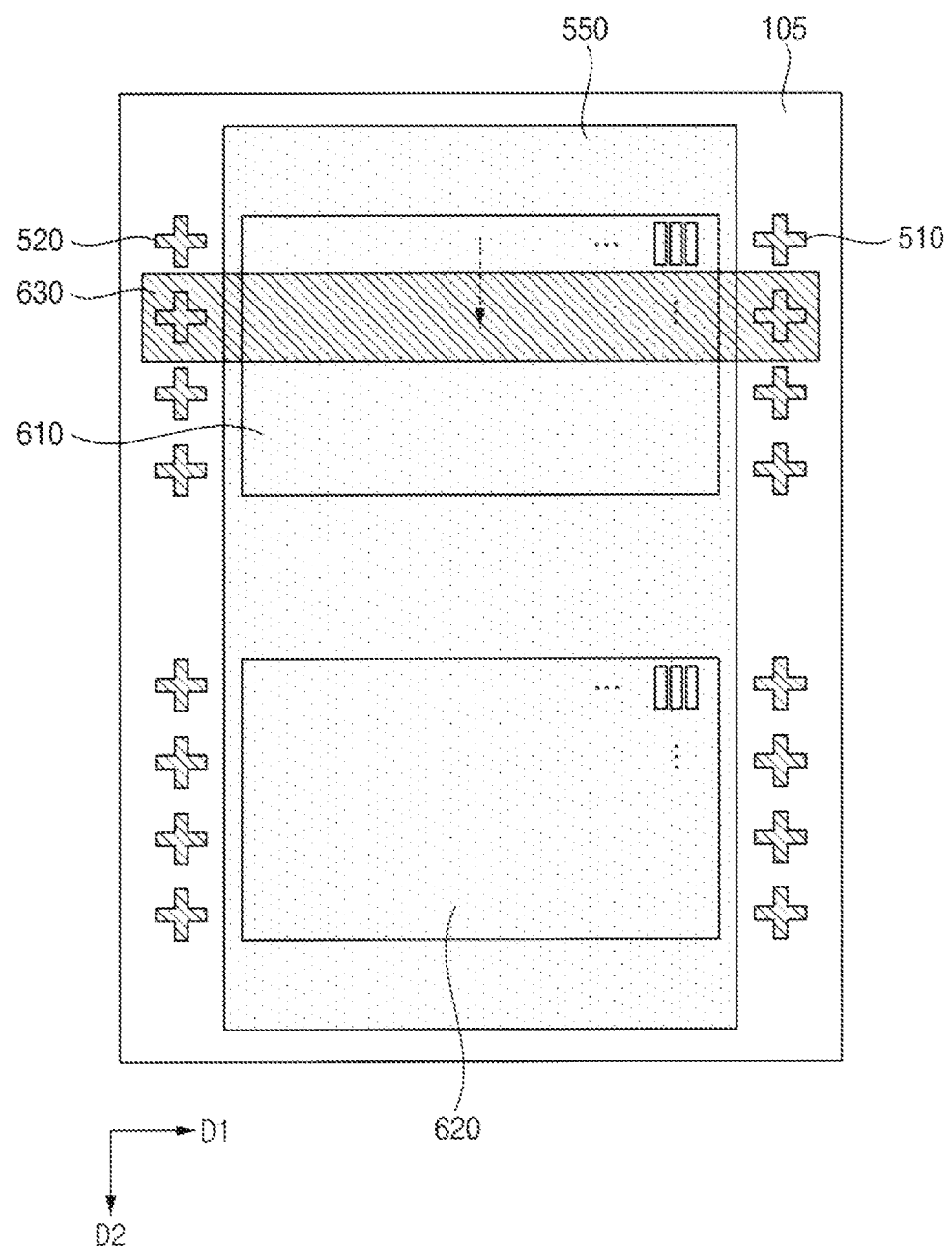
Figure 13:
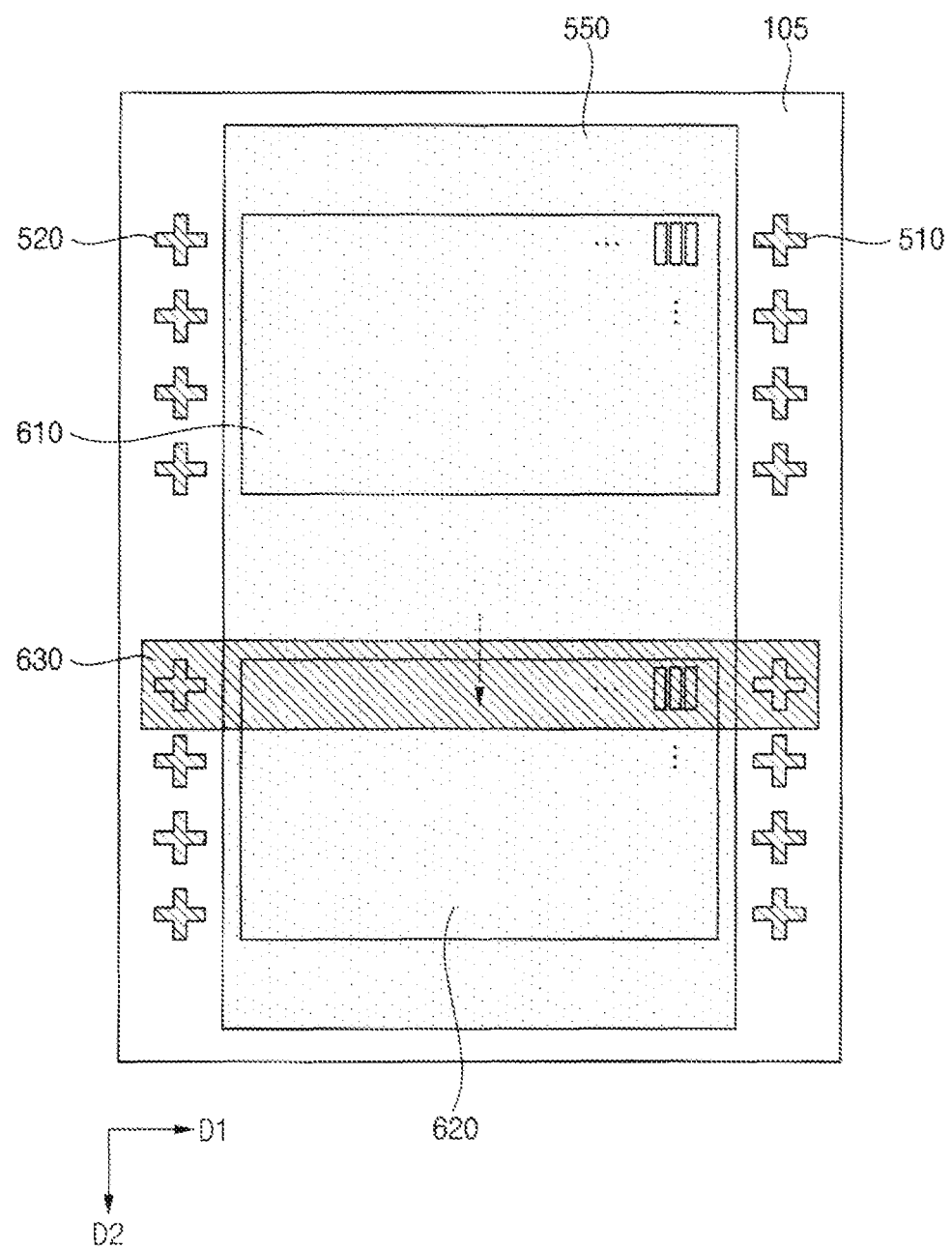
Figure 14:
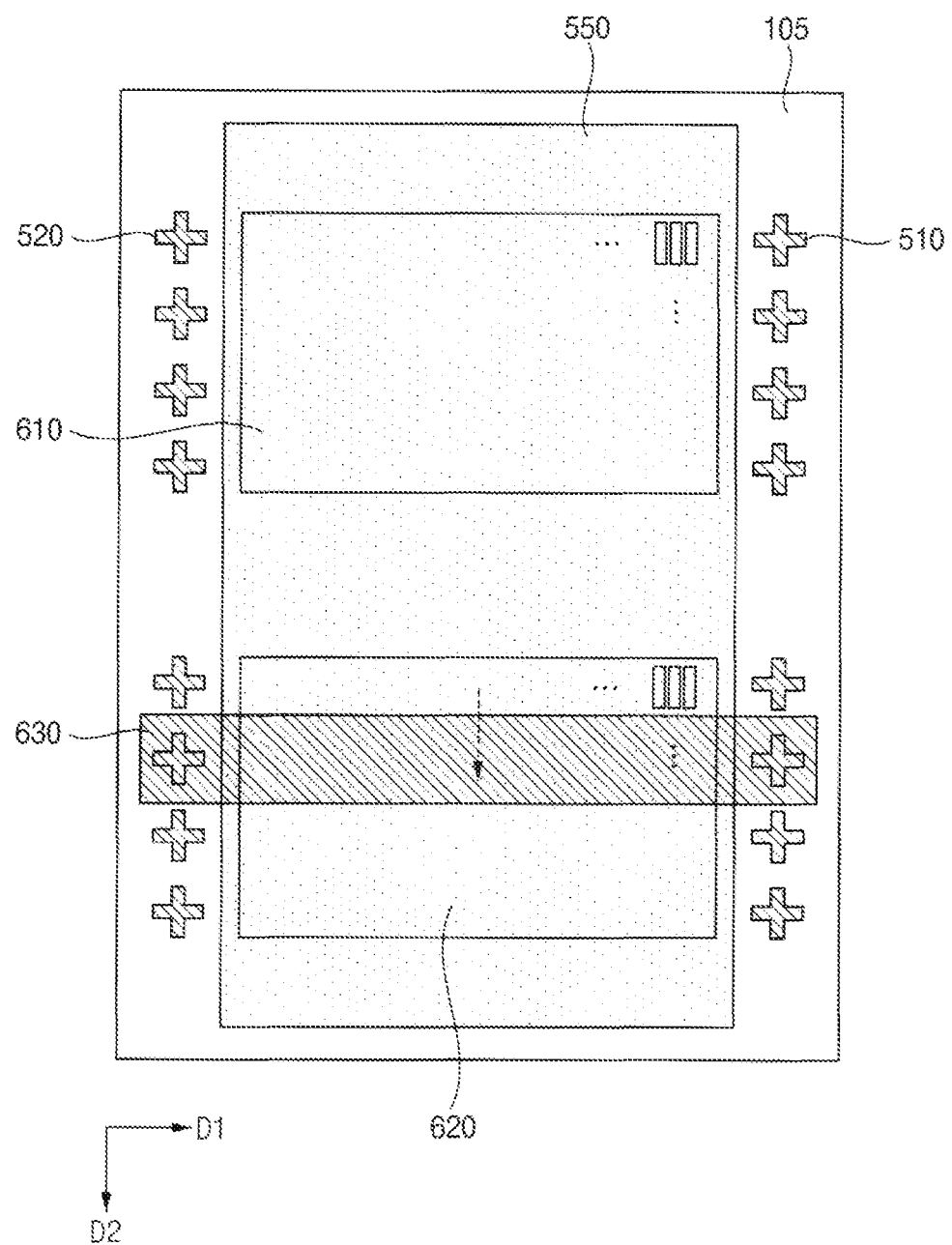

FIGS. 12, 13, and 14 are plan views for describing a state in which the mask 630 of FIG. 9 is moved.

Referring to FIG. 12, after the light is irradiated from the exposer 1630 to the photoresist 550 located on the first portion of the first light emitting structure 610, the mask 630 may be moved in the second direction D2. In other words, the mask 630 may be positioned such that the mask 630 may overlap a second portion of the first light emitting structure 610 by moving the mask 630 in the direction in which the first and second alignment keys 510 and 520 are arranged. Except for the second portion where the mask 630 is positioned, a light blocking member for blocking a light may be located in the remaining portion.

The exposer 1630 may be placed on the mask 630 that overlaps the second portion of the first light emitting structure 610. After the exposer 1630 is placed on the mask 630, a light may be emitted from the exposer 1630. The emitted light may be irradiated to the photoresist 550 located under the opening 631 through the opening 631 of the mask 630. In this way, the exposure process may be performed on the photoresist 550 formed on the first light emitting structure 610.

Referring to FIGS. 13 and 14, after the exposure process of the photoresist 550 formed on the first light emitting structure 610 is performed, the mask 630 may be positioned such that the mask 630 may overlap a first portion of the second light emitting structure 620 on the photoresist 550 by moving the mask 630 in the second direction D2. Except for the first portion where the mask 630 is positioned, a light blocking member for blocking a light may be located in the remaining portion.

The exposer 1630 may be placed on the mask 630 that overlaps the first portion of the second light emitting structure 620. After the exposer 1630 is placed on the mask 630, a light may be emitted from the exposer 1630. The emitted light may be irradiated to the photoresist 550 located under the opening 631 through the opening 631 of the mask 630.

After the light is irradiated from the exposer 1630 to the photoresist 550 located on the first portion of the second light emitting structure 620, the mask 630 may be moved in the second direction D2. In other words, the mask 630 may be positioned such that the mask 630 may overlap a second portion of the second light emitting structure 620 by moving the mask 630 in the direction in which the first and second alignment keys 510 and 520 are arranged. Except for the second portion where the mask 630 is positioned, a light blocking member for blocking a light may be located in the remaining portion.

The exposer 1630 may be placed on the mask 630 that overlaps the second portion of the second light emitting structure 620. After the exposer 1630 is placed on the mask 630, a light may be emitted from the exposer 1630. The emitted light may be irradiated to the photoresist 550 located under the opening 631 through the opening 631 of the mask 630. In this way, the exposure process may be performed on the photoresist 550 formed on the second light emitting structure 620.

However, although the exposure process has been performed while the mask 630 according to an embodiment moves on the photoresist 550 according to process conditions, embodiments are not limited thereto. For example, when a mask having a relatively large size is provided, the exposure process may be performed at one time on the photoresist 550 formed on the first light emitting structure 610 and the second light emitting structure 620.

After the exposure process is performed, a development process may be performed on the mother substrate 105 by using a developer. In this case, the photoresist 550 to which the light is irradiated may remain, and the photoresist 550 to which the light is not irradiated may be removed by the developer.

Figure 15:
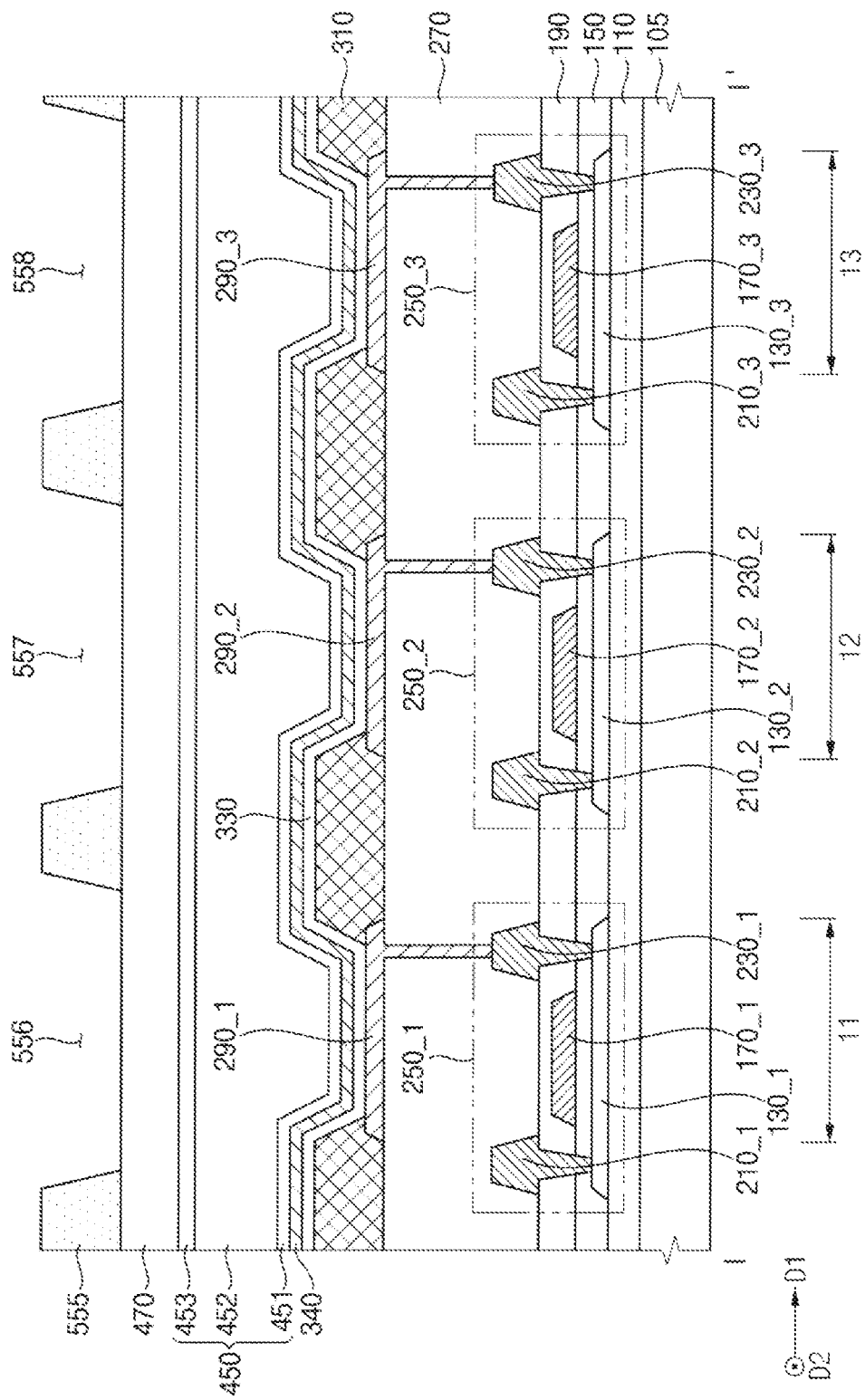
Figure 16:
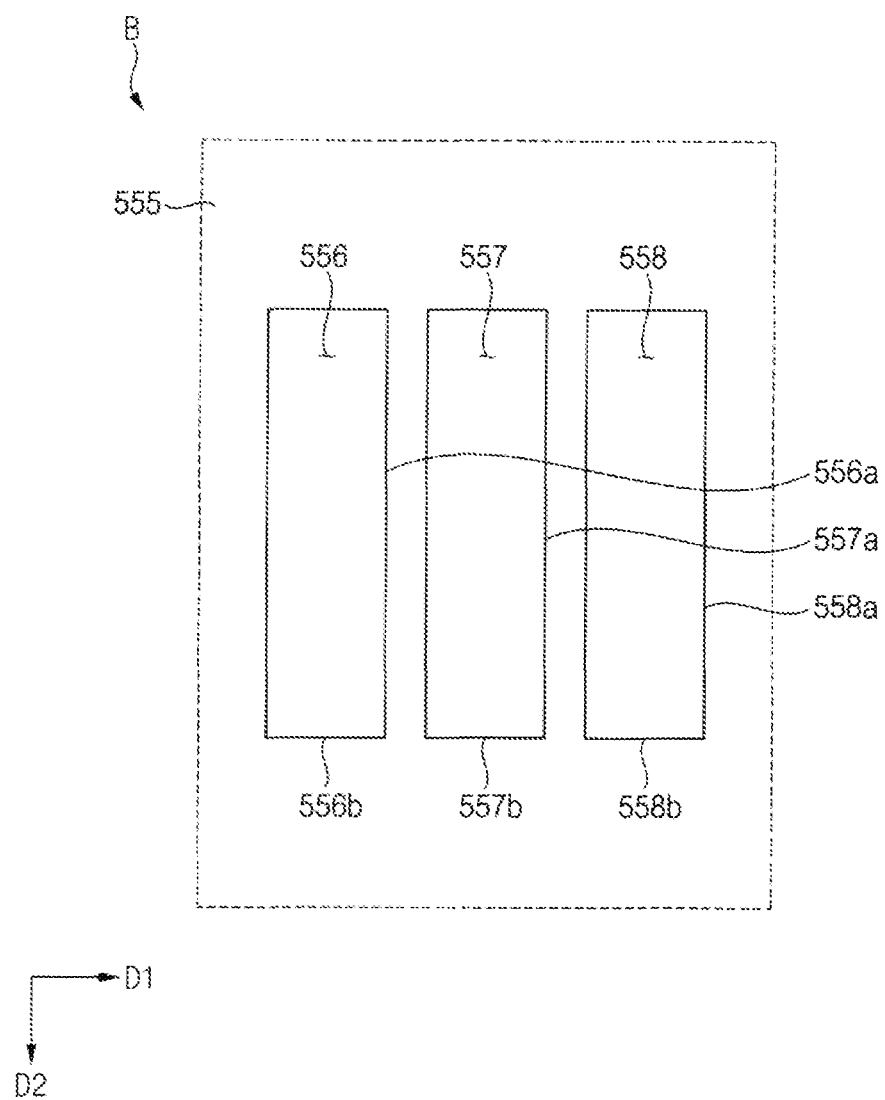

FIG. 15 is a sectional view showing a partition wall structure 555 formed on a first capping layer 470 of FIG. 11. FIG. 16 is a partially enlarged plan view showing a region B of FIG. 9.

Referring to FIG. 15, a partition wall structure 555 may be formed through the development process. The partition wall structure 555 may include first, second, and third openings 556, 557, and 558. For example, the first opening 556 may overlap the first sub-pixel region 11, the second opening 557 may overlap the second sub-pixel region 12, and the third opening 558 may overlap the third sub-pixel region 13. According to the embodiments, the partition wall structure 555 may be a negative photoresist including titanium dioxide. For example, in order to increase a luminance of the display device, the partition wall structure 555 may include titanium dioxide, which is a scattering material.

Referring to FIG. 16, the first opening 556 may have a long side 556a and a short side 556b, the second opening 557 may have a long side 557a and a short side 557b, and the third opening 558 may have a long side 558a and a short side 558b. In this case, a direction in which each of the long side 556a of the first opening 556, the long side 557a of the second opening 557, and the long side 558a of the third opening 558 extends may be identical to the second direction D2 or the direction in which the first and second alignment keys 510 and 520 are arranged (or the direction in which the exposer 1630 moves).

For example, according to the conventional method of manufacturing the display device, the exposure process was performed without rotating a mother substrate at a preset angle. In this case, a direction in which an exposer moves may be different from a long side direction of each of first to third pixel regions (or a long side direction of each of openings of a partition wall structure). In other words, the direction in which the exposer moves was identical to a short side direction of each of the first to third pixel regions (or a short side direction of each of the openings of the partition wall structure). In this case, there is an overexposed portion when a development process is divisionally performed by moving a mask, so that a residual film exists in the opening of the partition wall structure, which causes a defect in a conventional display device. In addition, when the mother substrate is not rotated at a preset angle, since first and second cell regions are arranged in the first direction D1, the exposure process is performed twice in the vertical direction, so that a process time may be relatively long.

According to the embodiments, the direction in which the exposer 1630 moves may be identical to the direction in which each of the long side 556a of the first opening 556, the long side 557a of the second opening 557, and the long side 558a of the third opening 558 extends, so that a residual film may not be generated in the first opening 556, the second opening 557, and the third opening 558 after the development process. In addition, the direction in which the exposer 1630 moves may be identical to a direction in which the first light emitting structure 610 and the second light emitting structure 620 are arranged, so that the exposure process may be performed in one pass, and thus a process time may be relatively reduced.

Figure 17:
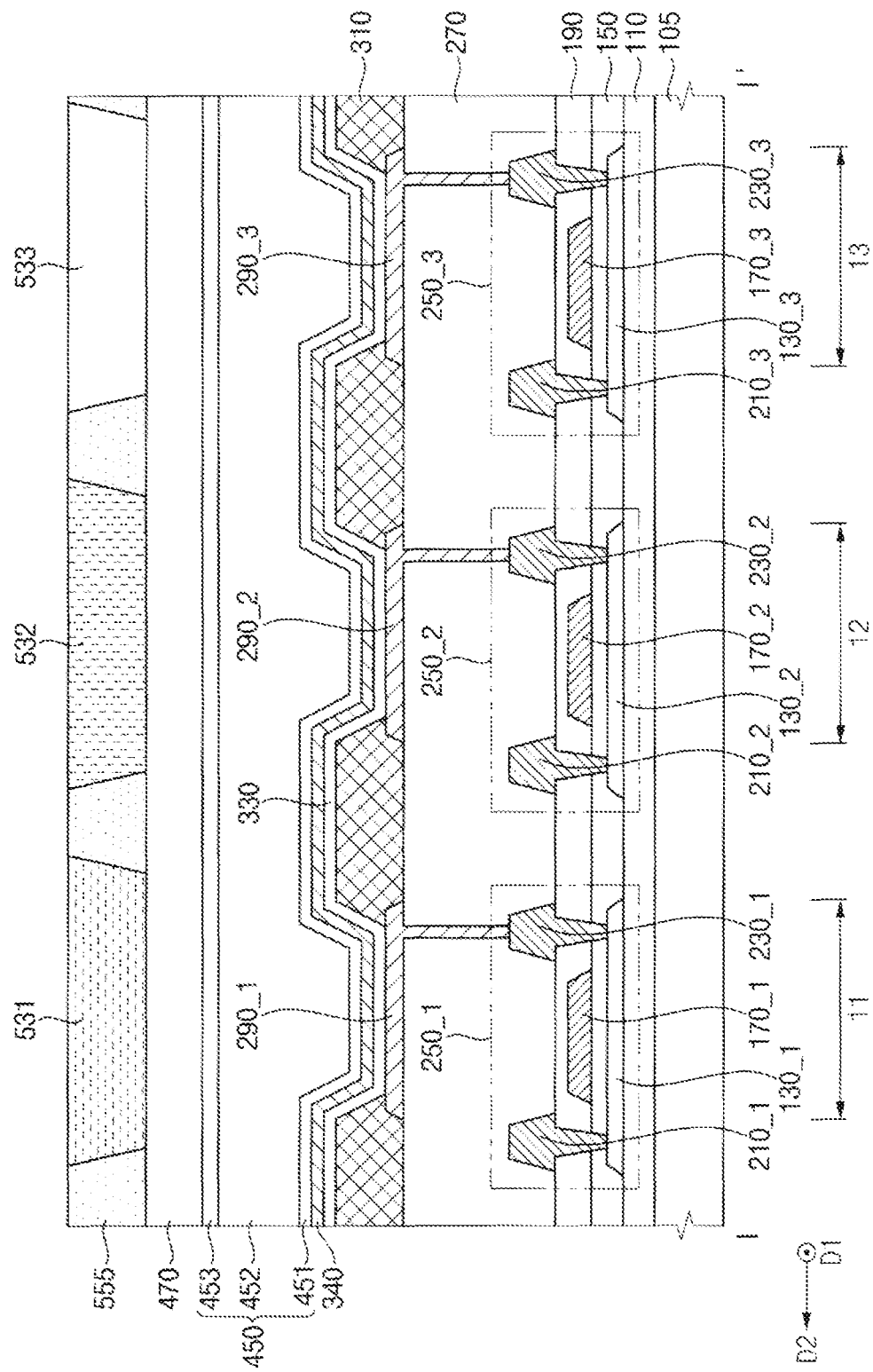

FIG. 17 is a sectional view for describing a first quantum dot layer 531, a second quantum dot layer 532, and a scattering layer 533 formed in first to third openings 556, 557, and 558 of the partition wall structure 555 of FIG. 16.

Referring to FIG. 17, a first quantum dot layer 531 may be formed in the first opening 556 of the partition wall structure 555. In other words, the first quantum dot layer 531 may overlap the first sub-pixel region 11. According to the embodiments, the first quantum dot layer 531 may convert a blue light into a red light. For example, the first quantum dot layer 531 may include a plurality of quantum dots configured to absorb the blue light and emit the red light.

A second quantum dot layer 532 may be formed in the second opening 557 of the partition wall structure 555. In other words, the second quantum dot layer 532 may overlap the second sub-pixel region 12. According to the embodiments, the second quantum dot layer 532 may convert a blue light into a green light. For example, the second quantum dot layer 532 may include a plurality of quantum dots configured to absorb the blue light and emit the green light.

The quantum dots included in each of the first quantum dot layer 531 and the second quantum dot layer 532 may be formed by using one nanocrystal among a silicon (Si)-based nanocrystal, a group II-VI-based compound semiconductor nanocrystal, a group III-V-based compound semiconductor nanocrystal, a group IV-VI-based compound semiconductor nanocrystal, and a mixture thereof. The group II-VI-based compound semiconductor nanocrystal may be one selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and HgZn-STe. The group III-V-based compound semiconductor nanocrystal may be one selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaIn-PAs, InAlNP, InAlNAs, and InAlPAs. The group IV-VI-based compound semiconductor nanocrystal may be SbTe.

Even when the quantum dots included in each of the first quantum dot layer 531 and the second quantum dot layer 532 include the same material, an emission wavelength may vary according to a size of the quantum dot. For example, as the size of the quantum dot decreases, a light having a shorter wavelength may be emitted. Therefore, a light within a desired visible light region may be emitted by adjusting the size of the quantum dot included in each of the first quantum dot layer 531 and the second quantum dot layer 532.

According to the embodiments, the quantum dots included in the first quantum dot layer 531 and the second quantum dot layer 532 may be formed of the same material, and the size of the quantum dot included in the first quantum dot layer 531 may be larger than the size of the quantum dot included in the second quantum dot layer 532.

A scattering layer 533 may be formed in the third opening 558 of the partition wall structure 555. In other words, the scattering layer 533 may overlap the third sub-pixel region 13. According to the embodiments, the scattering layer 533 may include a scattering material for emitting a blue light. For example, the scattering material may include titanium dioxide (TiO$_2$). In other words, the scattering layer 533 may not include the quantum dots. In some embodiments, each of the first quantum dot layer 531 and the second quantum dot layer 532 may further include the scattering material.

Figure 18:
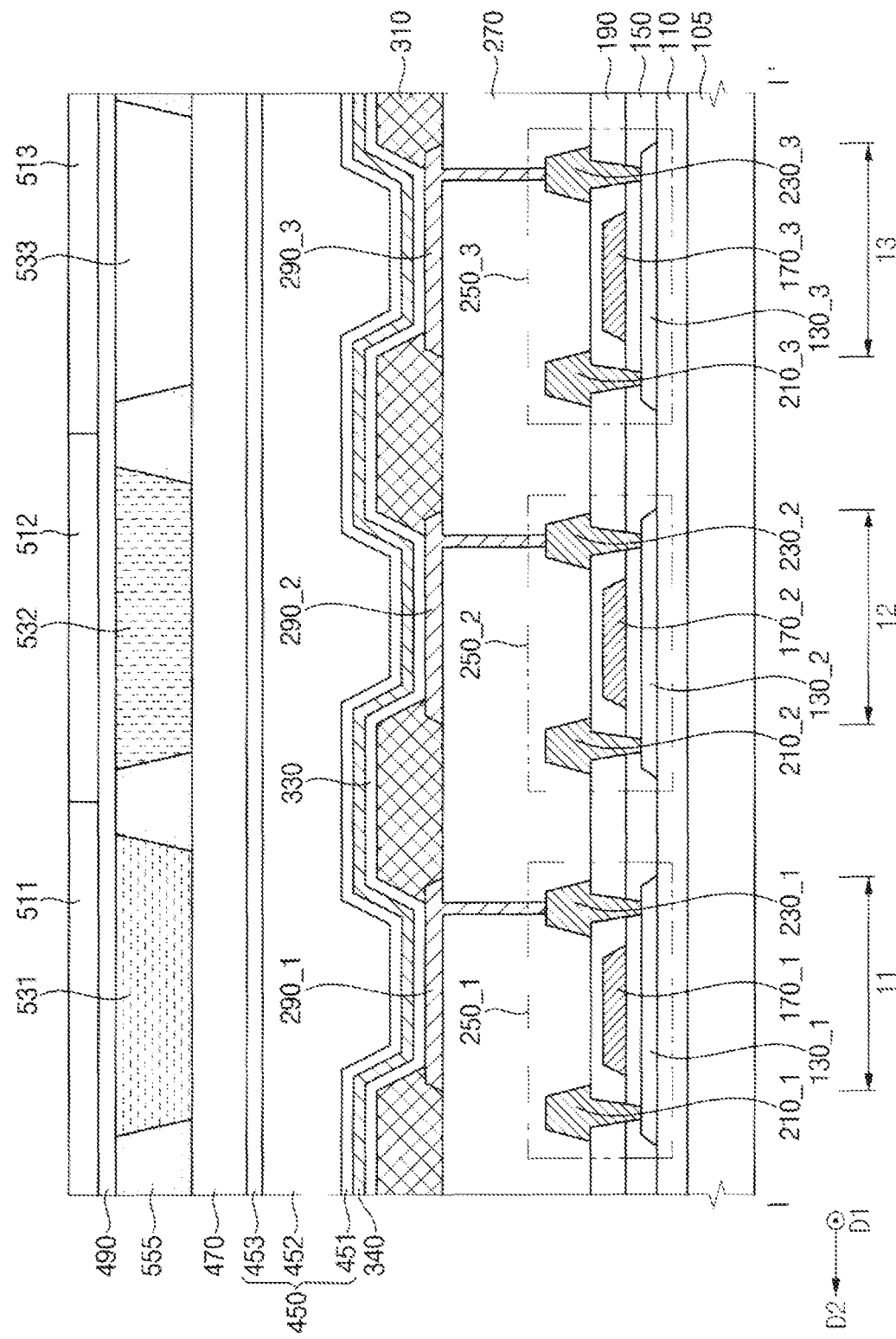

FIG. 18 shows that a second capping layer 490, a first color filter 511, a second color filter 512, and a third color filter 513 may be formed on the partition wall structure 555, the first quantum dot layer 531, the second quantum dot layer 532, and the scattering layer 533 of FIG. 17.

Referring to FIG. 18, a second capping layer 490 may be formed on the partition wall structure 555, the first quantum dot layer 531, the second quantum dot layer 532, and the scattering layer 533. The second capping layer 490 may protect the first quantum dot layer 531, the second quantum dot layer 532, and the scattering layer 533. The second capping layer 490 may be formed by using an organic insulating material or an inorganic insulating material. In some embodiments, the second capping layer 490 may be formed by using a high-hardness polymer material such as siloxane.

A first color filter 511 may be formed on the second capping layer 490 to overlap the first sub-pixel region 11, and the first color filter 511 may be a color filter configured to transmit a red light and having a red color.

A second color filter 512 may be formed on the second capping layer 490 to overlap the second sub-pixel region 12, and the second color filter 512 may be a color filter configured to transmit a green light and having a green color.

A third color filter 513 may be formed on the second capping layer 490 to overlap the third sub-pixel region 13, and the third color filter 513 may be a color filter configured to transmit a blue light and having a blue color.

Each of the first, second, and third color filters 511, 512, and 513 may be formed by using a photosensitive resin or a color photoresist.

However, although the first, second, and third color filters 511, 512, and 513 according to an embodiment have been described as including the red, green, and blue color filters, embodiments are not limited thereto. For example, the first, second, and third color filters 511, 512, and 513 may include a yellow color filter, a cyan color filter, and a magenta color filter.

An additional process may be performed on the first color filter 511, the second color filter 512, and the third color filter 513 to form a first cell in the first cell region 10 and form a second cell in the second cell region 20. After the first and second cells are formed, an outer periphery of each of the first and second cells may be cut through a cutting process, and the first and second cells may function as display devices.

However, although the display device according to an embodiment has been described as specifically being an organic light emitting diode display device, embodiments are not limited thereto. For example, the configuration of the present disclosure may be applied to various display devices including the process of forming the partition wall structure 555 by using the photoresist 550 including titanium dioxide (TiO$_2$), which is the scattering material.

According to the method of manufacturing the display device of the embodiments of the present disclosure, even when the photoresist 550 includes titanium dioxide (TiO$_2$), the photoresist 550 may not overlap the first and second alignment keys 510 and 520, so that the first and second alignment keys 510 and 520 may be easily recognized in the mask alignment process that will be subsequently performed. Accordingly, an amount of the titanium dioxide (TiO$_2$) may be increased in the photoresist 550, so that the luminance of the display device may be further increased.

In addition, the direction in which the exposer 1630 moves may be identical to the direction in which each of the long sides 556a, 557a, and 558a of the first, second, and third openings 556, 557, and 558 of the partition wall structure 555 extends, so that the residual film may not be generated in the first, second, and third openings 556, 557, and 558 after the development process. Accordingly, defects in the first, second, and third openings 556, 557, and 558 of the partition wall structure 555 may be relatively reduced.

Furthermore, the direction in which the exposer 1630 moves may be identical to the direction in which the first light emitting structure 610 and the second light emitting structure 620 are arranged, so that the exposure process may be performed in one pass. Accordingly, the process time during which the exposure process is performed may be relatively reduced.

Figure 19:
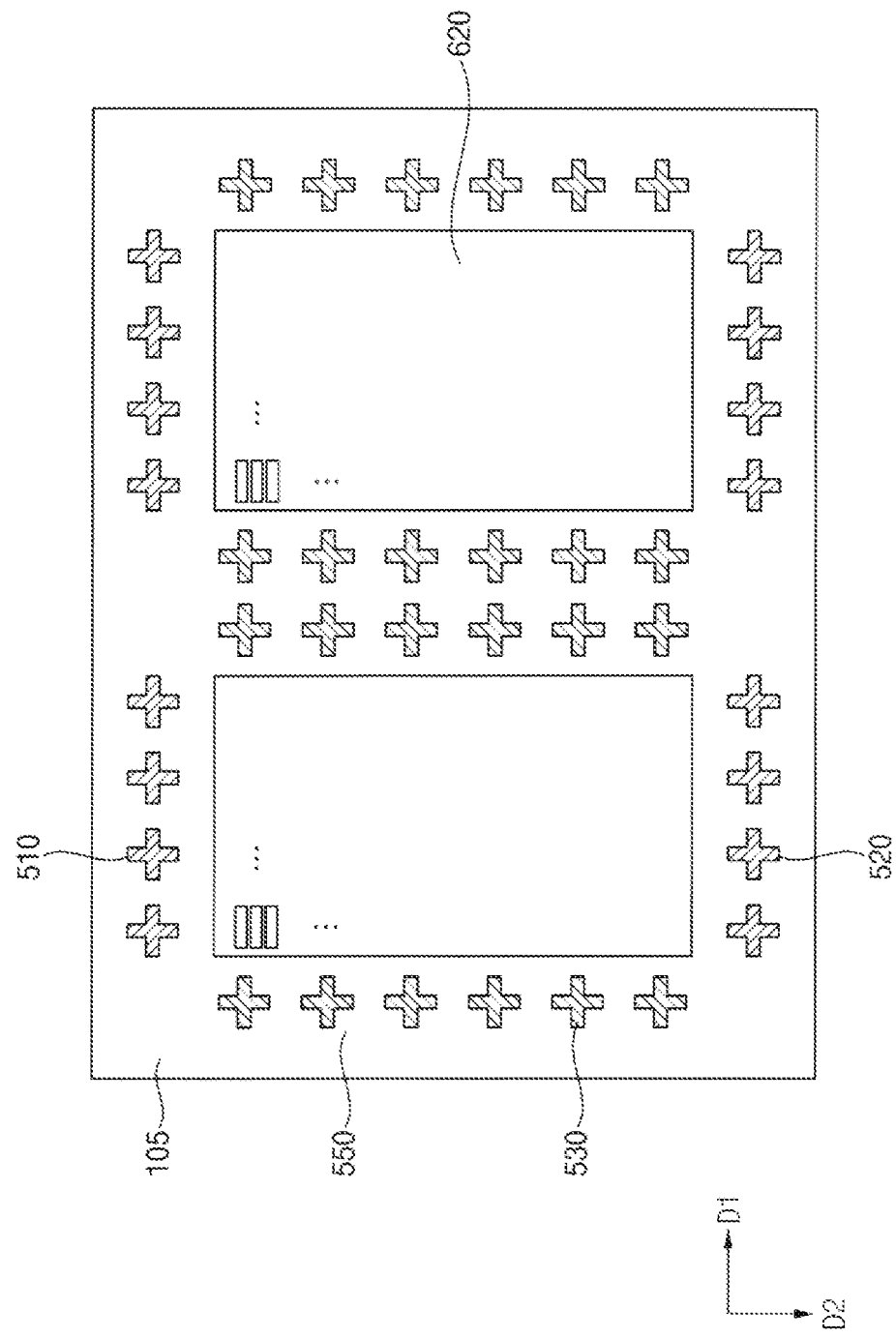
FIG. 19 is a plan view for describing first and second light emitting structures formed in a first cell region and a second cell region on a mother substrate, respectively, and first, second, and third alignment keys formed in a peripheral region.
Figure 20:
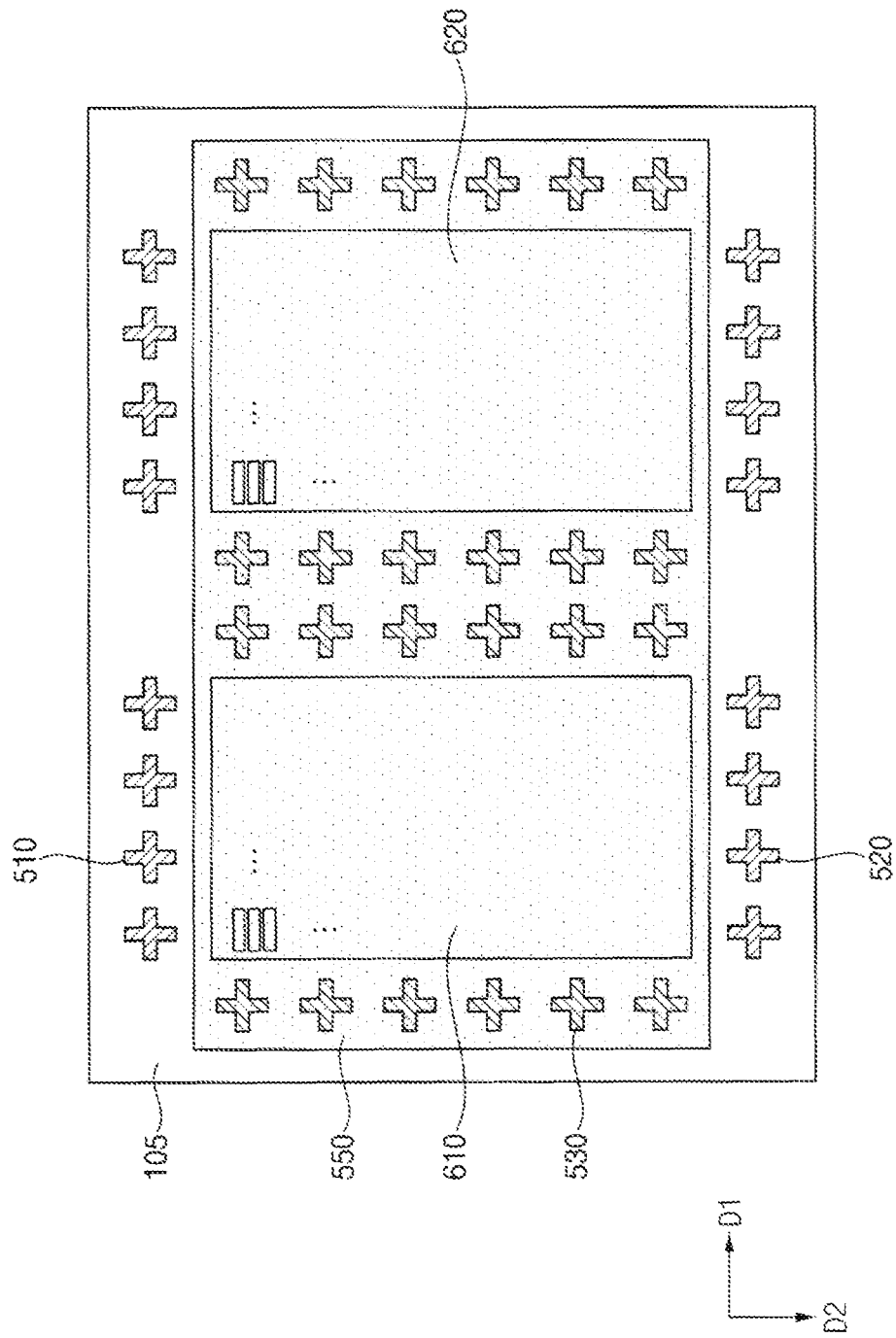
FIG. 20 is a cross-sectional view showing a state in which a photoresist is formed on the first and second light emitting structures of FIG. 19.
Figure 21:
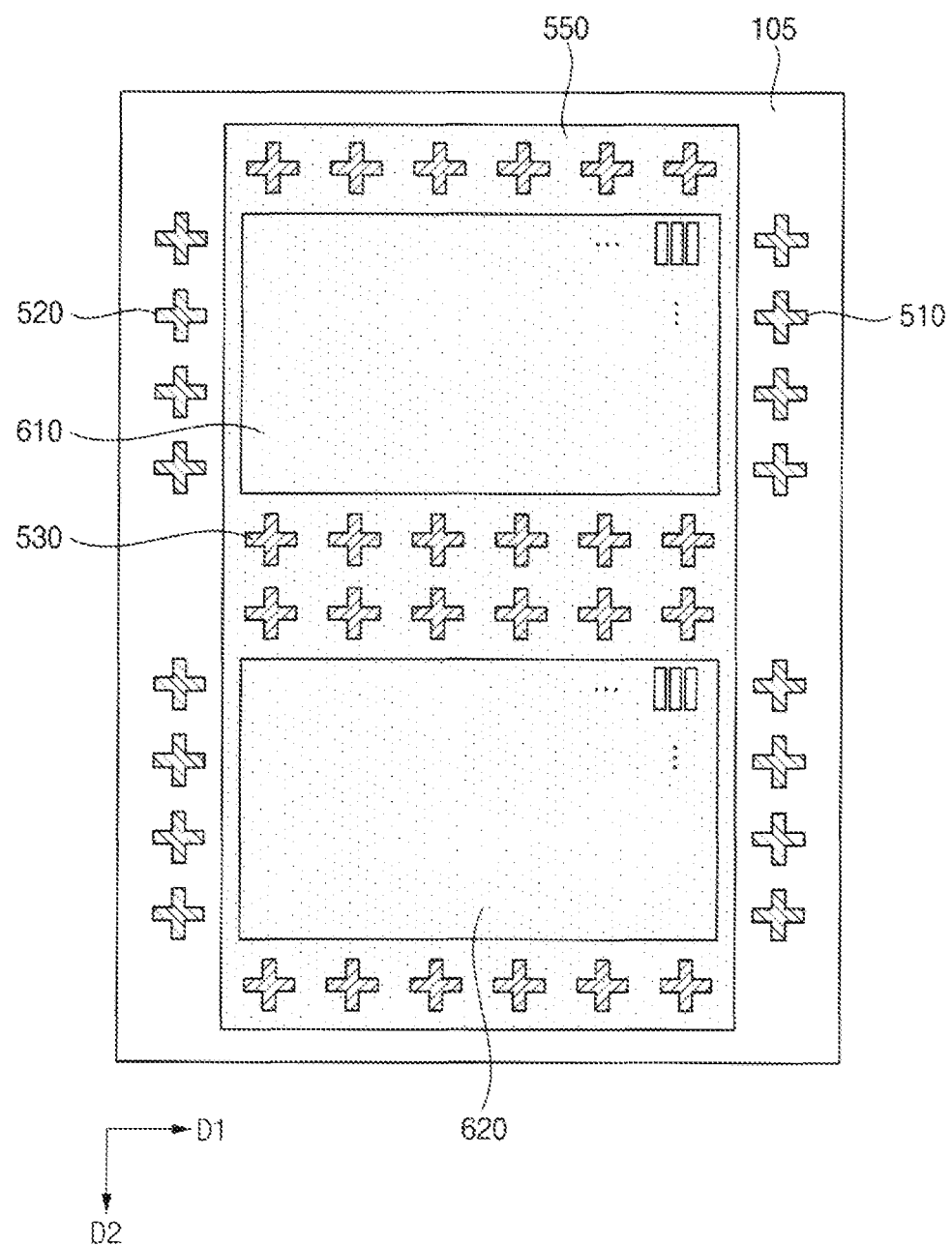
FIG. 21 is a plan view showing a state in which the mother substrate of FIG. 20 is rotated at a preset angle.

FIGS. 19 to 21 are views showing a method of manufacturing a display device according to embodiments of the present disclosure. The method of manufacturing the display device illustrated in FIGS. 19 to 21 may have a configuration that is substantially identical or similar to the configuration of the method of manufacturing the display device described with reference to FIGS. 1 to 18 except for third alignment keys 530. In FIGS. 19 to 21, redundant descriptions of components that are substantially identical or similar to the components described with reference to FIGS. 1 to 18 will be omitted.

FIG. 19 is a plan view for describing first and second light emitting structures formed in a first cell region 10 and a second cell region 20 on a mother substrate 105, respectively, and first, second, and third alignment keys 510, 520, and 530 formed in a peripheral region 30. FIG. 20 is a cross-sectional view showing a state in which a photoresist 550 is formed on the first and second light emitting structures 610 and 620 of FIG. 19. FIG. 21 is a plan view showing a state in which the mother substrate 105 of FIG. 20 is rotated at a preset angle.

Referring to FIG. 19, a first light emitting structure 610 may be formed in a first cell region 10 on the mother substrate 105, and a second light emitting structure 620 may be formed in a second cell region 20 on the mother substrate 105.

First alignment keys 510, second alignment keys 520, and third alignment keys 530 may be formed in a peripheral region 30 of the mother substrate 105. The first alignment keys 510 may be adjacent to a first side portion of each of the first light emitting structure 610 and the second light emitting structure 620 (or a first short side of the first cell region 10 and a first short side of the second cell region 20), and may be arranged in the first direction D1. The second alignment keys 520 may be adjacent to a second side portion of each of the first light emitting structure 610 and the second light emitting structure 620 (or a second short side of the first cell region 10 and a second short side of the second cell region 20), and may be arranged in the first direction D1.

The third alignment keys 530 may be adjacent to third and fourth side portions of each of the first light emitting structure 610 and the second light emitting structure 620 (or first and second long sides of the first cell region 10 and first and second long sides of the second cell region 20), and may be arranged in the second direction D2. In other words, the first, second, and third alignment keys 510, 520, and 530 may surround each of the first and second light emitting structures 610 and 620.

In addition, the first alignment keys 510 and the second alignment keys 520 may oppose each other, and may be substantially parallel to each other. The third alignment keys 530 arranged in the second direction D2 may oppose each other, and may be substantially parallel to each other.

Each of the first alignment keys 510, the second alignment keys 520, and the third alignment keys 530 may have a cross shape when viewed in a plan view.

According to embodiments, the first alignment keys 510, the second alignment keys 520, and the third alignment keys 530 may be simultaneously formed while the first light emitting structure 610 and the second light emitting structure 620 are formed in the first cell region 10 and the second cell region 20 on the mother substrate 105, respectively.

For example, the first, second, and third alignment keys 510, 520, and 530 may be simultaneously formed in a process of forming first to third active layers 130_1, 130_2, and 130_3, first to third gate electrodes 170_1, 170_2, and 170_3, first, second, and third source electrodes 210_1, 210_1, and 210_3, and first, second, and third drain electrodes 230_1, 230_2, and 230_3. In other words, the first, second, and third alignment keys 510, 520, and 530 may be formed simultaneously with the first to third active layers 130_1, 130_2, and 130_3, the first to third gate electrodes 170_1, 170_2, and 170_3, the first, second, and third source electrodes 210_1, 210_1, and 210_3, or the first, second, and third drain electrodes 230_1, 230_2, and 230_3 by using the same material as the first to third active layers 130_1, 130_2, and 130_3, the first to third gate electrodes 170_1, 170_2, and 170_3, the first, second, and third source electrodes 210_1, 210_1, and 210_3, or the first, second, and third drain electrodes 230_1, 230_2, and 230_3.

According to the embodiments, the third alignment keys 530 may be used in a mask alignment process used in a process of forming a planarization layer 270, a mask alignment process used in a process of forming a pixel defining layer 310, and the like, and the first and second alignment keys 510 and 520 may be used in a mask alignment process used in a process of forming a partition wall structure 555 that will be subsequently performed.

Referring to FIG. 20, a photoresist 550 may be formed on the mother substrate 105 by using a coater 1550. The photoresist 550 may be formed in the second direction D2 on the first and second light emitting structures 610 and 620 without overlapping the first alignment keys 510 and the second alignment keys 520. In this process, the photoresist 550 may cover the third alignment keys 530. In other words, the photoresist 550 may be formed in the first cell region 10, the second cell region 20, and a portion of the peripheral region 30 surrounding the first and second cell regions 10 and 20, may expose the first and second alignment keys 510 and 520, and may overlap the third alignment keys 530.

The photoresist 550 may include titanium oxide ($TiO_x$). According to the embodiments, the photoresist 550 may be a negative photoresist including titanium dioxide ($TiO_2$).

Referring to FIG. 21, the mother substrate 105 on which the photoresist 550 is formed may be rotated at a preset angle by using a turntable. According to the embodiments, the preset angle may be approximately 90 degrees.

After the mother substrate 105 is rotated at the preset angle, each of the first alignment keys 510 and the second alignment keys 520 may be defined as being arranged in the second direction D2, and the third alignment keys 530 may be defined as being arranged in the first direction D1. In addition, after the mother substrate 105 is rotated at the preset angle, the first light emitting structure 610 and the second light emitting structure 620 may be defined as being spaced apart from each other in the second direction D2.

After the mother substrate 105 is rotated at the preset angle, display devices may be manufactured through the manufacturing method shown in FIGS. 9 to 18.

Figure 22:
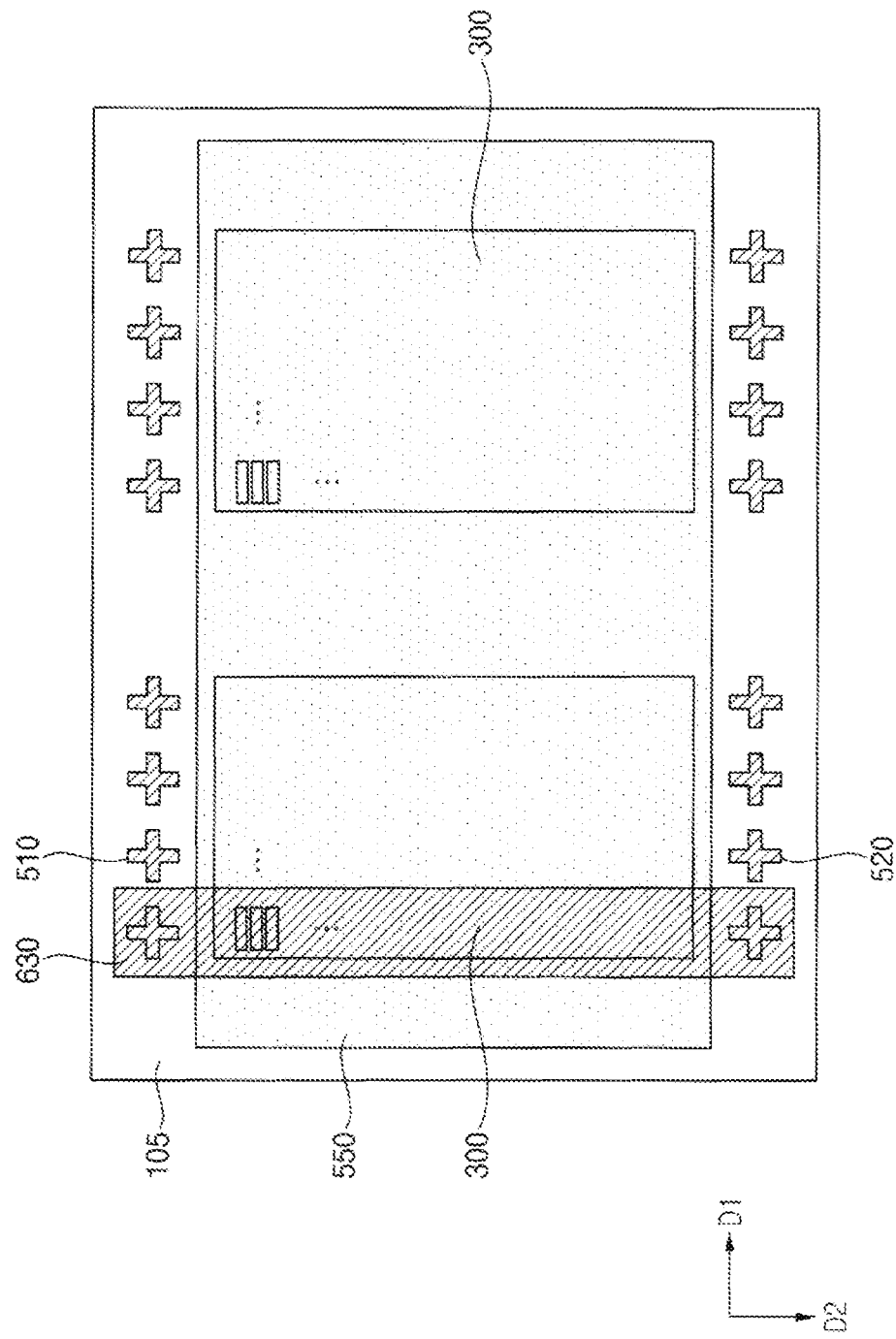
FIG. 22 is a plan view for describing a mask located on a photoresist.
Figure 23:
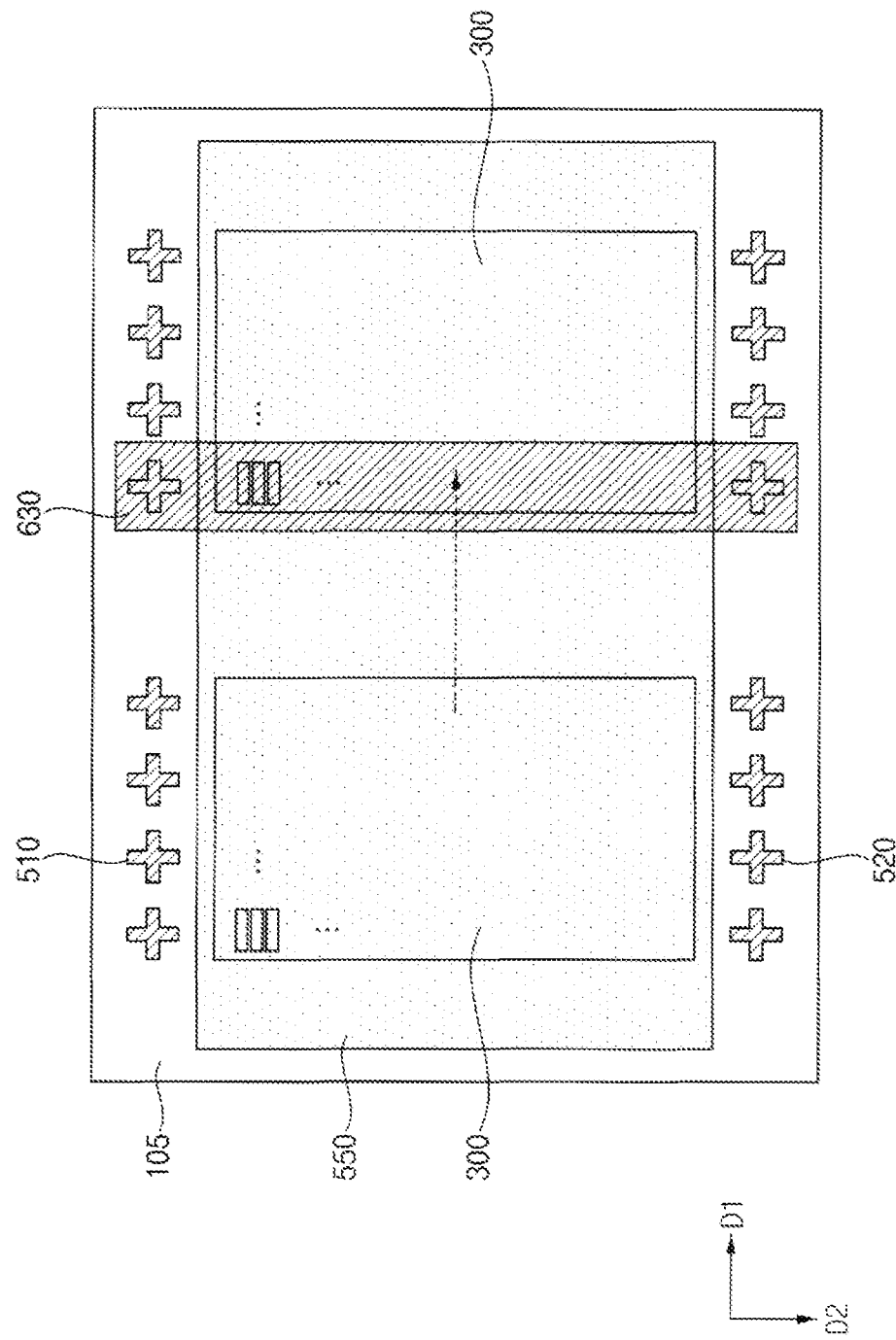
FIG. 23 is a plan view for describing a state in which the mask of FIG. 22 is moved.

FIGS. 22 and 23 are views showing a method of manufacturing a display device according to embodiments of the present disclosure. The method of manufacturing the display device illustrated in FIGS. 22 and 23 may have a configuration that is substantially identical or similar to the configuration of the method of manufacturing the display device described with reference to FIGS. 1 to 18 except for a movement direction of the exposer 1630. In FIGS. 22 and 23, redundant descriptions of components that are substantially identical or similar to the components described with reference to FIGS. 1 to 18 will be omitted.

FIG. 22 is a plan view for describing a mask 630 located on a photoresist 550. FIG. 23 is a plan view for describing a state in which the mask 630 of FIG. 22 is moved.

Referring to FIG. 22, when compared with FIG. 9, a mother substrate 105 of FIG. 22 may not be rotated. According to embodiments, the exposer 1630 may move only in a horizontal direction (e.g., the first direction D1 or the direction in which the first and second alignment keys 510 and 520 are arranged). In this case, it is unnecessary to rotate the mother substrate 105.

In other words, after a photoresist 550 is formed on the mother substrate 105, the mask 630 may be positioned on the photoresist 550 by using the first alignment keys 510 and the second alignment keys 520 without a rotation of the mother substrate 105. Thereafter, an exposure process may be performed while the mask 630 moves in the first direction D1.

The present disclosure may be applied to a method of manufacturing a display device by performing an exposure process. For example, the present disclosure may be applied to numerous electronic devices such as a method of manufacturing vehicle-display devices, a method of manufacturing ship-display devices, a method of manufacturing aircraft-display devices, a method of manufacturing portable communication devices, a method of manufacturing exhibition display devices, a method of manufacturing information transfer display devices, a method of manufacturing medical-display devices, etc.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing a display device, the method comprising:
   on a mother substrate including a first cell region, a second cell region, and a peripheral region, forming first alignment keys arranged in a first direction in the peripheral region on the mother substrate such that the first alignment keys are adjacent to a first side portion of each of first and second light emitting structures; while forming the first and second light emitting structures in the first and second cell regions on the mother substrate, respectively;
   after forming first alignment keys, forming a photoresist in a second direction on the first and second light emitting structures by using a coater such that the photoresist does not to overlap the first alignment keys, the second direction intersecting the first direction;
   rotating the mother substrate at a preset angle after forming the photoresist; and
   irradiating a light to the photoresist by moving an exposer in a direction in which the first alignment keys are arranged after rotating the mother substrate at the preset angle.

2. The method of claim 1, wherein the photoresist includes titanium oxide.

3. The method of claim 1, further comprising forming second alignment keys, which are adjacent to a second side portion of each of the first and second light emitting structures, such that the second alignment keys oppose the first alignment keys, simultaneously with the forming of the first alignment keys, wherein
   the first alignment keys including more than two first alignment keys disposed in a straight line, and
   the second alignment keys including more than two second alignment keys disposed in a straight line.

4. The method of claim 3, wherein the mother substrate includes first and second long sides extending in the first direction, and first and second short sides extending in the second direction,
   the first alignment keys are adjacent to the first long side of the mother substrate, and
   the second alignment keys are adjacent to the second long side of the mother substrate.

5. The method of claim 4, wherein:
   each of the first and second light emitting structures includes:
      first and second short sides extending in the first direction and adjacent to the first and second long sides of the mother substrate, respectively; and
      first and second long sides extending in the second direction,
   the first long side of the first light emitting structure is adjacent to the first short side of the mother substrate,
   the second long side of the second light emitting structure is adjacent to the second short side of the mother substrate, and
   the second long side of the first light emitting structure and the first long side of the second light emitting structure are adjacent to each other.

6. The method of claim 5, wherein the first and second side portions of each of the first and second light emitting structures correspond to the first and second short sides of each of the first and second light emitting structures, respectively.

7. The method of claim 3, further comprising positioning a mask on the photoresist by using the first and second alignment keys, before the irradiating of the light to the photoresist.

8. The method of claim 7, wherein a width of the mask in the direction in which the first alignment keys are arranged is smaller than a width of each of the first and second light emitting structures in the direction in which the first alignment keys are arranged.

9. The method of claim 7, wherein the positioning of the mask on the photoresist includes:
   positioning the mask such that the mask overlaps a first portion of the first light emitting structure on the photoresist;
   positioning the mask such that the mask overlaps a second portion of the first light emitting structure by moving the mask in the direction in which the first alignment keys are arranged;
   positioning the mask such that the mask overlaps a first portion of the second light emitting structure on the photoresist by moving the mask in the direction in which the first alignment keys are arranged; and
   positioning the mask such that the mask overlaps a second portion of the second light emitting structure on the photoresist by moving the mask in the direction in which the first alignment keys are arranged.

10. The method of claim 3, further comprising forming third alignment keys, which are adjacent to third and fourth side portions of each of the first and second light emitting structures, such that the third alignment keys surround the first and second light emitting structures together with the first and second alignment keys, simultaneously with the forming of the first alignment keys.

11. The method of claim 10, wherein the third alignment keys overlap the photoresist.

12. The method of claim 1, further comprising forming a partition wall structure including first to third openings, after the irradiating of the light to the photoresist.

13. The method of claim 12, wherein each of the first to third openings includes a long side and a short side, and
   a direction in which the long side extends is identical to the direction in which the first alignment keys are arranged.

14. The method of claim 12, wherein, after the forming of the partition wall structure, the method further comprises:

forming first and second quantum dot layers and a scattering layer in the first to third openings, respectively; and forming first to third color filters on the first and second quantum dot layers and the scattering layer, respectively.

15. The method of claim 1, wherein the coater and the exposer move only in the second direction.

16. The method of claim 1, wherein, when the mother substrate is rotated at the preset angle, the first alignment keys are defined as being arranged in the second direction.

17. The method of claim 1, wherein the first cell region and the second cell region are spaced apart from each other in the first direction, and the peripheral region surrounds the first and second cell regions.

\* \* \* \* \*